(12) United States Patent
Kim et al.

(10) Patent No.: US 12,146,090 B2
(45) Date of Patent: *Nov. 19, 2024

(54) QUANTUM DOTS AND COMPOSITE AND DISPLAY DEVICE INCLUDING THE SAME

(71) Applicant: SAMSUNG ELECTRONICS CO., LTD., Suwon-si (KR)

(72) Inventors: Taekhoon Kim, Suwon-si (KR); Nayoun Won, Suwon-si (KR); Tae Gon Kim, Suwon-si (KR); Mi Hye Lim, Suwon-si (KR); Shin Ae Jun, Suwon-si (KR); Shang Hyeun Park, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/223,709

(22) Filed: Jul. 19, 2023

(65) Prior Publication Data

US 2023/0365861 A1 Nov. 16, 2023

Related U.S. Application Data

(63) Continuation of application No. 17/092,368, filed on Nov. 9, 2020, now Pat. No. 11,912,920.

(30) Foreign Application Priority Data

Nov. 8, 2019 (KR) .......................... 10-2019-0142622

(51) Int. Cl.
| | | |
|---|---|---|
| *C09K 11/88* | (2006.01) |
| *C09K 11/02* | (2006.01) |
| *H10K 50/115* | (2023.01) |
| *B82Y 15/00* | (2011.01) |
| *B82Y 40/00* | (2011.01) |
| *C01B 25/08* | (2006.01) |

(52) U.S. Cl.
CPC ............ *C09K 11/883* (2013.01); *C09K 11/02* (2013.01); *H10K 50/115* (2023.02); *B82Y 15/00* (2013.01); *B82Y 40/00* (2013.01); *C01B 25/087* (2013.01)

(58) Field of Classification Search
CPC ..... C09K 11/883; C09K 11/02; C09K 11/565; C09K 11/62; C09K 11/70; C09K 11/71; C09K 11/025; H10K 50/115; B82Y 15/00; B82Y 40/00; B82Y 20/00; C01B 25/087; H05B 33/14; C08K 3/30; C08K 3/32; G02F 1/1336; G03F 7/004; G03F 7/027; G09F 9/33
See application file for complete search history.

(56) References Cited

U.S. PATENT DOCUMENTS

| | | |
|---|---|---|
| 7,476,487 B2 | 1/2009 | Park et al. |
| 7,746,423 B2 | 6/2010 | Im et al. |
| 9,196,682 B2 | 11/2015 | Jang et al. |
| 10,074,770 B2 | 9/2018 | Park et al. |
| 10,126,587 B2 | 11/2018 | Chung |
| 10,246,634 B2 | 4/2019 | Yang et al. |
| 10,508,236 B2 | 12/2019 | Houtepen et al. |
| 10,520,765 B2 | 12/2019 | Chung |
| 10,533,127 B2 | 1/2020 | Park et al. |
| 10,559,712 B2 | 2/2020 | Park et al. |
| 10,689,511 B2 | 6/2020 | Ahn et al. |
| 10,741,731 B2 | 8/2020 | Jang et al. |
| 10,782,611 B2 | 9/2020 | Yang et al. |
| 11,142,685 B2 | 10/2021 | Won et al. |
| 11,355,583 B2 | 6/2022 | Kwon et al. |
| 11,505,740 B2 | 11/2022 | Won et al. |
| 11,512,252 B2 | 11/2022 | Park et al. |
| 11,667,838 B2 | 6/2023 | Moriyama et al. |
| 11,746,290 B2 | 9/2023 | Kim et al. |
| 11,912,920 B2 * | 2/2024 | Kim ................... C09K 11/883 |
| 2017/0052444 A1 | 2/2017 | Park et al. |

(Continued)

FOREIGN PATENT DOCUMENTS

| | | |
|---|---|---|
| CN | 105602545 A | 5/2016 |
| CN | 106701059 A | 5/2017 |

(Continued)

OTHER PUBLICATIONS

Arnaud Cros-Gagneux, et al., J. AM. CHEM. SOC. 2010, 132, 18147-18157.
David A. Browne, et al., Electron transport in unipolar InGaN/GaN multiple quantum well structures grown by NH3 molecular beam epitaxy, Journal of Applied Physics 117, 185703 (2015); doi: 10.1063/1.4919750.
Extended European Search Report dated Feb. 26, 2021, of the corresponding European Patent Application No. 20206222.0.

(Continued)

*Primary Examiner* — Donald L Raleigh
(74) *Attorney, Agent, or Firm* — CANTOR COLBURN LLP

(57) ABSTRACT

A quantum dot-polymer composite including a polymer matrix; and core-shell quantum dots dispersed in the polymer matrix, wherein the core-shell quantum dots include a semiconductor nanocrystal core including indium, zinc, and phosphorus and a semiconductor nanocrystal shell disposed on the semiconductor nanocrystal core, the shell including zinc, selenium, and sulfur. The core-shell quantum dots do not include cadmium, the core-shell quantum dots are configured to emit green light, the core-shell quantum dots have a mole ratio of phosphorus to indium of greater than or equal to about 0.75, and the core-shell quantum dots have a mole ratio of zinc to indium of greater than or equal to about 35, and a method of producing the core-shell quantum dots, and a display device including a light emitting element that includes the quantum dot-polymer composite.

19 Claims, 7 Drawing Sheets

(56) References Cited

U.S. PATENT DOCUMENTS

| | | |
|---|---|---|
| 2017/0088775 A1 | 3/2017 | Park et al. |
| 2017/0183565 A1 | 6/2017 | Jun et al. |
| 2018/0094190 A1 | 4/2018 | Kim et al. |
| 2018/0119007 A1 | 5/2018 | Ippen et al. |
| 2018/0142149 A1 | 5/2018 | Youn et al. |
| 2018/0179441 A1* | 6/2018 | Park .................. H10K 85/1135 |
| 2019/0112527 A1 | 4/2019 | Moriyama et al. |
| 2019/0177608 A1 | 6/2019 | Chisaka et al. |
| 2019/0185743 A1 | 6/2019 | Kim et al. |
| 2019/0211260 A1 | 7/2019 | Won et al. |
| 2019/0211262 A1 | 7/2019 | Park et al. |
| 2020/0199449 A1 | 6/2020 | Houtepen et al. |
| 2020/0220043 A1 | 7/2020 | Park et al. |

FOREIGN PATENT DOCUMENTS

| | | |
|---|---|---|
| CN | 107663452 A | 2/2018 |
| CN | 108395892 A | 8/2018 |
| CN | 109075222 A | 12/2018 |
| CN | 110028948 A | 7/2019 |
| EP | 3184603 A1 | 6/2017 |
| EP | 3336158 A1 | 6/2018 |
| EP | 3514615 A1 | 7/2019 |
| EP | 3660124 A1 | 6/2020 |
| EP | 3760692 A | 1/2021 |
| KR | 101641016 B1 | 7/2016 |
| KR | 1020160120359 A | 10/2016 |
| KR | 1020170022951 A | 3/2017 |
| KR | 1020170034055 A | 3/2017 |
| KR | 1020170048220 A | 5/2017 |
| KR | 20170074585 A | 6/2017 |
| KR | 1020170080795 A | 7/2017 |
| KR | 1020180058208 A | 5/2018 |
| KR | 20180075599 A | 7/2018 |
| KR | 1020180081002 A | 7/2018 |
| KR | 1020180096535 A | 8/2018 |
| KR | 1020190019863 A | 2/2019 |
| KR | 1020190032017 A | 3/2019 |
| KR | 1020190073301 A | 6/2019 |
| KR | 1020190085884 A | 7/2019 |
| KR | 1020190085885 A | 7/2019 |

OTHER PUBLICATIONS

Francesca Pietra, et al., Ga for Zn Cation Exchange Allows for Highly Luminescent and Photostable InZnP-Based Quantum Dots, Chem. Mater. 2017, 29, 5192-5199.

Héloïse Virieux, et al., J. Am. Chem. Soc. 2012, 134, 19701-19708.

https://en.wikipedia.org/wiki/Atom_probe, 12 pp.

Mickael D. Tessier, et al., Chem. Mater. 2018, 30, 6877-6883.

Mickael D. Tessier, et al., Interfacial Oxidation and Photoluminescence of InP-Based Core/Shell Quantum Dots, Chem. Mater. 2018, 30, 6877-6883.

Nathalie Claes, et al., Characterization of Janus gold nanoparticles obtained via spontaneous binary polymer shell segregation; The 16th European Microscopy Congress 2016, DOI: 10.1002/9783527808465.EMC2016.5982.

Yongsoo Yang et al., "Deciphering chemical order/disorder and material properties at the single-atom level," Nature, Feb. 2, 2017, pp. 75-79, vol. 542.

English Translation of Office Action dated Aug. 30, 2023, of the corresponding Chinese Patent Application No. 202011238165.4, 18 pp.

Office Action dated Aug. 30, 2023, of the corresponding Chinese Patent Application No. 202011238165.4, 11 pp.

\* cited by examiner

Pattern Preparation by using a photoresist

Repeating the Patterning Process three times

QUANTUM DOTS AND COMPOSITE AND DISPLAY DEVICE INCLUDING THE SAME

CROSS-REFERENCE TO RELATED APPLICATION

This application is a continuation application of U.S. patent application Ser. No. 17/092,368 filed Nov. 9, 2020, now U.S. Pat. No. 11,912,920, which in turn claims priority to Korean Patent Application No. 10-2019-0142622 filed in the Korean Intellectual Property Office on Nov. 8, 2019, and all the benefits accruing therefrom under 35 U.S.C. §§ 119, 120, the contents of which in-their entirety are incorporated herein by reference.

BACKGROUND

1. Field

A quantum dot, a composite including the quantum dot, a method of preparing the quantum dots, and a display device including the composite is disclosed.

2. Description of the Related Art

Quantum dots (i.e., nano-sized semiconductor nanocrystals) may have different energy bandgaps by controlling the size and composition of the nanocrystals, and thus, may emit light of various photoluminescence wavelengths. Quantum dots may exhibit electroluminescence and photoluminescence properties. In a wet chemical process of making the quantum dots, organic materials such as ligands are coordinated to a surface of the semiconductor nanocrystal during a crystal growth to provide quantum dots having a controlled particle size and luminescence properties. Luminescence properties of quantum dots may be applied to various fields including as light emitting elements, e.g., in electronic displays. It is desirable to develop a quantum dot that is environmentally-friendly and improved luminescence properties.

SUMMARY

An embodiment provides an environmentally friendly (e.g., cadmium-free) quantum dot that may exhibit improved luminescence properties and improved stability.

Another embodiment provides a method of preparing the quantum dot.

Another embodiment provides a quantum dot-polymer composite including the quantum dot.

Another embodiment provides a stacked structure and an electronic device (for example, display) including the quantum dot-polymer composite.

In an embodiment, a quantum dot-polymer composite includes a polymer matrix; and quantum dots dispersed in the polymer matrix,
wherein the quantum dots include core-shell quantum dots including a semiconductor nanocrystal core including indium, zinc, and phosphorus, and a semiconductor nanocrystal shell disposed on the semiconductor nanocrystal core, the semiconductor nanocrystal shell including zinc, selenium, and sulfur,
wherein the core-shell quantum dots do not include cadmium, and the core-shell quantum dots are configured to emit green light,
wherein the core-shell quantum dots have a mole ratio of phosphorus to indium of greater than or equal to about 0.75:1, and the core-shell quantum dots have a mole ratio of zinc to indium of greater than or equal to about 35:1.

The core-shell quantum dots may have a mole ratio (S:Se) of sulfur to selenium of less than or equal to about 1:1.

The core-shell quantum dots may have a mole ratio of sulfur to selenium of less than or equal to about 0.9:1.

The core-shell quantum dots may have a mole ratio of sulfur to selenium of greater than or equal to about 0.3:1.

A maximum (photo)luminescence peak wavelength of the green light may be greater than or equal to about 500 nanometers (nm).

The core-shell quantum dots may have a mole ratio of phosphorus to indium is greater than or equal to about 0.8:1 and less than or equal to about 0.98:1, and/or the mole ratio of zinc to indium is greater than or equal to about 40:1 and less than or equal to about 55:1.

The maximum (photo)luminescence peak wavelength of the green light may be less than or equal to about 550 nm.

The maximum (photo)luminescence peak wavelength of the green light may be less than or equal to about 538 nm.

A quantum efficiency of the quantum dot-polymer composite may be greater than or equal to about 75%.

The quantum efficiency of the quantum dot-polymer composite may be greater than or equal to about 80%.

The quantum efficiency of the quantum dot-polymer composite may be greater than or equal to about 85%.

The quantum dot-polymer composite may have a blue light conversion efficiency of greater than or equal to about 30% after heat treatment at 180° C. for 30 minutes.

The core-shell quantum dots may be configured to have a valley depth (VD) defined by the following equation of greater than or equal to about 0.4:

$$1-(\text{Abs}_{valley}/\text{Abs}_{first})=VD$$

wherein, $\text{Abs}_{first}$ is an absorption at the first absorption peak, and $\text{Abs}_{valley}$ is an absorption at the lowest point of the valley adjacent to the first absorption peak.

The valley depth may be greater than or equal to about 0.5.

The core-shell quantum dots may have a mole ratio of phosphorus to indium of less than or equal to about 1.2:1.

The core-shell quantum dots may have mole ratio of zinc to indium of less than or equal to about 55:1.

The core-shell quantum dots may have a mole ratio of a sum of sulfur and selenium to indium of greater than or equal to about 10:1, for example, greater than or equal to about 30:1, or greater than or equal to about 35:1.

The core-shell quantum dots may have a mole ratio of a sum of sulfur and selenium to indium of less than or equal to about 45:1, for example, less than or equal to about 42:1.

The semiconductor nanocrystal shell may include a first shell layer including zinc and selenium, and a second shell layer including zinc and sulfur disposed on the first shell layer.

The first shell layer may be disposed directly on the semiconductor nanocrystal core. The first shell layer may or may not include sulfur.

The second shell layer may not include selenium.

A thickness of the second shell layer may be less than about 0.7 nm.

The second shell layer may be an outermost layer of the semiconductor nanocrystal shell.

In a low temperature photoluminescence spectroscopy analysis measured at a temperature of 77K (e.g., using a light source of a wavelength of 400 nm) of the core-shell quantum dots, a ratio of an area of a trap emission peak(s)

(for example, present at a wavelength of greater than or equal to about 600 nm or 650 nm) (e.g., integrated areas of the peaks determined by deconvolution of a maximum photoluminescent peak in a region apart from a center wavelength thereof by about −0.45 eV or more) to a total area of a maximum emission peak (hereinafter, also referred to as a deep trap ratio) may be less than or equal to about 4%, less than or equal to about 3%, or less than or equal to about 2%.

The core-shell quantum dots may not include gallium.

The core-shell quantum dots may have a size (or an average particle size) of less than or equal to about 7 nm.

The polymer matrix may include a linear polymer, a crosslinked polymer, or a combination thereof.

The crosslinked polymer may include a thiolene polymer, a crosslinked poly(meth)acrylate, a crosslinked polyurethane, a crosslinked epoxy resin, a crosslinked vinyl polymer, a crosslinked silicone resin, or a combination thereof.

The linear polymer may include a repeating unit derived from a monomer including a carbon-carbon unsaturated bond, and optionally, a carboxylate group.

The crosslinked polymer may include a polymerization product of photopolymerizable monomers including a carbon-carbon double bond, a polymerization product between a photopolymerizable monomer and a multiple thiol compound having at least two thiol groups at the terminal end, or a combination thereof.

The polymer matrix may include a carboxylic acid group-containing compound,
  wherein the carboxylic acid group-containing compound may include
  a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group, or a copolymer thereof;
  a multiple aromatic ring-containing polymer having a backbone structure where two aromatic rings are bound to a quaternary carbon atom that is a constituent atom of another cyclic moiety in the main chain and including a carboxylic acid group (—COOH); or a combination thereof.

The carboxylic acid group-containing compound may have an acid value of greater than or equal to about 50 mg KOH/g. The carboxylic acid group-containing compound may have a molecular weight of greater than or equal to about 100 g/mol (e.g., greater than or equal to about 400 g/mol) and less than or equal to about 50,000 g/mol (e.g., less than or equal to about 15,000 g/mol, less than or equal to about 13,000 g/mol, less than or equal to about 10,000 g/mol, or less than or equal to about 8500 g/mol).

The quantum dot-polymer composite may further include metal oxide particles dispersed in the polymer matrix.

The quantum dot-polymer composite may have a shape of a patterned film.

In another embodiment, a composition may include (e.g., a plurality of) the aforementioned core-shell quantum dot(s); a dispersing agent; and (organic) solvents. The dispersing agent may include a carboxylic acid group-containing binder (or binder polymer).

The composition may further include a photopolymerizable monomer including a carbon-carbon double bond, and optionally (thermal or photo) initiator.

The carboxylic acid group-containing binder polymer may include
  a copolymer of a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;
  a multiple aromatic ring-containing polymer having a backbone structure where two aromatic rings are bound to a quaternary carbon atom that is a constituent atom of another cyclic moiety in the main chain and including a carboxylic acid group (—COOH); or a combination thereof.

In another embodiment, a display device includes a light source and photoluminescent element, wherein the photoluminescent element includes the aforementioned quantum dot-polymer composite and the light source is configured to provide the photoluminescent element with incident light.

The incident light may have a peak wavelength of about 440 nm to about 470 nm (or about 460 nm). The incident light may further include green light for example having a wavelength of from about 500 nm to about 560 nm.

The photoluminescent element may include a sheet of the quantum dot-polymer composite.

The photoluminescent element is a stacked structure including a substrate and a light emitting layer disposed on the substrate, and
  the light emitting layer may include a pattern of the quantum dot-polymer composite.

The pattern may include one or more repeating sections that emit light of a predetermined wavelength.

The pattern may include a first repeating section that emits first light.

The pattern may further include a second repeating section emitting a second light having a different center wavelength from the first light.

The display device may be configured to show a color reproducibility under BT2020 that is greater than or equal to about 80%.

In another embodiment, a quantum dot population may include core-shell quantum dots including a semiconductor nanocrystal core including indium, zinc, and phosphorus, and a semiconductor nanocrystal shell disposed on the semiconductor nanocrystal core, the semiconductor nanocrystal shell including zinc, selenium, and sulfur,
  wherein the core-shell quantum dots does not include cadmium,
  the core-shell quantum dots have a mole ratio of phosphorus to indium of greater than or equal to about 0.75:1 and less than or equal to about 1.5:1,
  the core-shell quantum dots have a mole ratio of zinc to indium of greater than or equal to about 33:1, and
  the core-shell quantum dots are configured to emit green light having a maximum (photo)luminescence peak wavelength of less than or equal to about 550 nm.

The core-shell quantum dots may have a mole ratio of phosphorus to indium of greater than or equal to about 0.8:1. The core-shell quantum dots may have a mole ratio of phosphorus to indium of less than or equal to about 1.4:1, less than or equal to about 1.3:1, less than or equal to about 1.2:1, or less than or equal to about 1.1:1.

The core-shell quantum dots may have a mole ratio of zinc to indium of greater than or equal to about 38:1, greater than or equal to about 40:1, greater than or equal to about 43:1, greater than or equal to about 44:1, greater than or equal to about 45:1, or greater than or equal to about 46:1.

The core-shell quantum dots may have a mole ratio of sulfur to selenium of less than or equal to about 1:1.

The core-shell quantum dots may have a mole ratio of sulfur to selenium of less than or equal to about 0.7:1, less than or equal to about 0.65:1, less than or equal to about 0.61:1, or less than or equal to about 0.6:1.

The core-shell quantum dots may have a mole ratio of sulfur to selenium of greater than or equal to about 0.3:1, greater than or equal to about 0.4:1, or greater than or equal to about 0.45:1.

The quantum dot population may have an average particle size of less than or equal to about 7 nm. The quantum dot population may have an average particle size of greater than or equal to about 5 nm.

The quantum dot population may have a size distribution (particle size standard deviation) of less than or equal to about 17% (of an average particle size).

The quantum dot population may have a size distribution of less than or equal to about 15% of the average particle size.

The green light may have a maximum (photo)luminescence peak wavelength of less than or equal to about 530 nm. The green light may have a maximum (photo)luminescence peak wavelength of less than or equal to about 525 nm. The green light may have a maximum (photo)luminescence peak wavelength of less than or equal to about 520 nm.

The core-shell quantum dots may have a quantum yield (or efficiency) of greater than or equal to about 80%.

The core-shell quantum dots may have a quantum yield of greater than or equal to about 85%.

In photoluminescence spectroscopy measured at 77K of the quantum dot population, a deep trap ratio may be less than or equal to about 4%, less than or equal to about 3%, or less than or equal to about 2%.

In an embodiment, the semiconductor nanocrystal core comprises a layered structure of InP/InZnP/InP, wherein a concentration gradient of zinc may increase and then decrease from the center toward the surface of the semiconductor nanocrystal core.

In another embodiment, a method of producing the aforementioned quantum dot population includes
    preparing a semiconductor nanocrystal core including indium, zinc, and phosphorus and
    reacting a zinc shell precursor and at least one of a selenium precursor and a sulfur precursor in the presence of the semiconductor nanocrystal core and the first organic ligand to form a semiconductor nanocrystal shell including zinc, selenium, and sulfur on the semiconductor nanocrystal core,
    wherein the preparing of the semiconductor nanocrystal core includes
    preparing an indium precursor solution by heating an indium compound in the presence of a second organic ligand and an organic solvent;
    optionally heating the indium precursor solution; and
    mixing the indium precursor solution (optionally heated) with the phosphorus precursor and a zinc core precursor simultaneously or sequentially, and performing a reaction at a reaction temperature,
    wherein a ratio between the precursors (and, optionally, a mixing manner between them) is adjusted to obtain a quantum dot having the aforementioned composition.

The mixing of the phosphorus precursor may be performed two or more times. The mixing of the zinc precursor may be performed two or more times. The method may further include adding an indium precursor solution to the reaction mixture (e.g., at least one times, two or more times).

In the above method, the zinc shell precursor may not include a halogen.

The forming of the shell may include injecting a halide and a Lewis base of an additional metal, and the additional metal may include aluminum, magnesium, gallium, antimony, titanium, or a combination thereof.

The Lewis base may include $R_3PO$ (wherein, R is a substituted or unsubstituted C1 to C40 aliphatic hydrocarbon group, a substituted or unsubstituted C6 to C40 aromatic hydrocarbon group, or a combination thereof).

The forming of the shell may further include injecting zinc halide.

The zinc halide may include a zinc chloride.

In an embodiment, a quantum dot-polymer composite includes a polymer matrix with quantum dots dispersed in the polymer matrix,
    wherein the quantum dots include a core-shell quantum dot including a semiconductor nanocrystal core comprising indium, zinc, and phosphorus, and a semiconductor nanocrystal shell disposed on the semiconductor nanocrystal core and including zinc, selenium, and sulfur,
    wherein the semiconductor nanocrystal core includes a layered structure of InP/InZnP/InP, wherein a concentration gradient of zinc may increase and then decrease from the center toward the surface of the semiconductor nanocrystal core,
    wherein the core-shell quantum dots have a mole ratio of phosphorus to indium of greater than or equal to about 0.75:1 and less than or equal to 1.2:1, and a mole ratio of zinc to indium of greater than or equal to about 35:1 and less than or equal to 55:1, and
    wherein the core-shell quantum dots do not include cadmium, and the core-shell quantum dots are configured to emit green light.

A display device is also described, the display device including a light source and a light emitting element, wherein the light emitting element comprises a color filter, and
    the light source is configured to provide the light emitting element with incident light.

In an embodiment, the color filter includes a patterned film of the aforementioned quantum dot-polymer composite, and the display device may further comprise a liquid crystal layer.

The core-shell quantum dots and quantum dot-polymer composite including the core-shell quantum dots according to an embodiment may exhibit improved luminescence properties. The core-shell quantum dots of an embodiment may be used in various display devices and biological labelling (e.g., bio sensor, bio imaging, etc.), a photo detector, a solar cell, a hybrid composite, and the like. The improved luminous efficiency of the core-shell quantum dots according to an embodiment may exhibit potential utility in quantum dot based photoluminescent type color filters. Such photoluminescent type color filters may be used in various blue light sources, for example, for example, blue light OLEDs, blue light emitting micro LEDs, liquid crystal displays including blue light sources.

DETAILED DESCRIPTION

Figure 1:
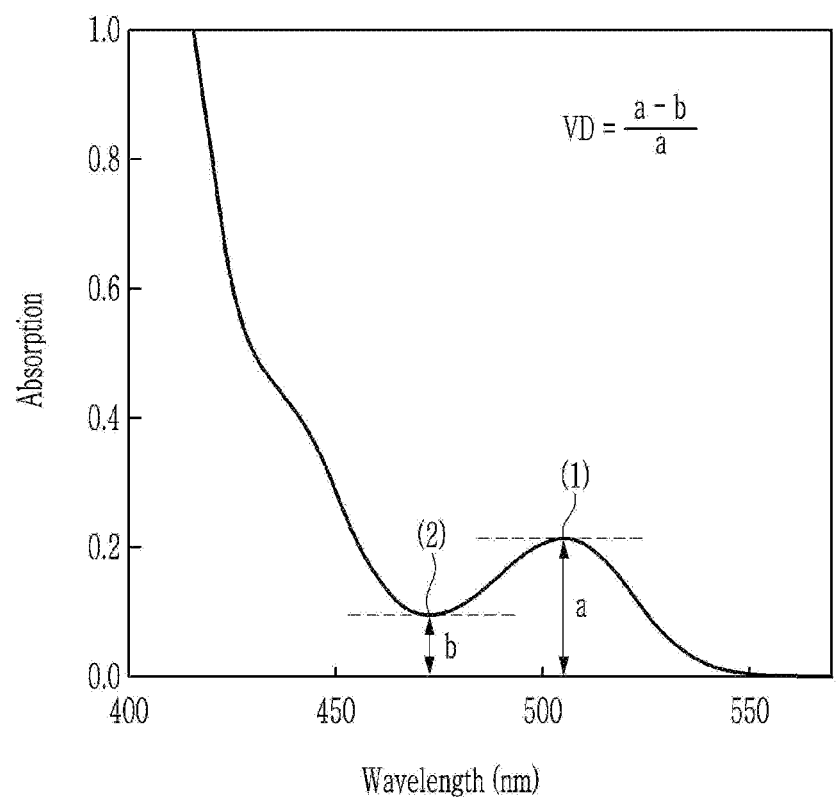
FIG. 1 is an illustration for explaining the concept of valley depth.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

Unless otherwise defined, all terms (including technical and scientific terms) in the specification may be defined as commonly understood by one skilled in the art. It will be further understood that terms, such as those defined in commonly dictionary should be interpreted as having a meaning that is consistent with their meaning in the context of the relevant art, and may not be interpreted ideally or exaggeratedly unless clearly defined. The terminology used herein is for the purpose of describing particular embodiments only and is not intended to be limiting.

As used herein, the singular forms "a," "an," and "the" are intended to include the plural forms, including "at least one," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, "substituted" refers to replacement of hydrogen of a compound by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 (or C15) cycloalkenyl group, a C3 (or C6) to C30 cycloalkynyl group, a C2 to C30 heterocycloalkyl group, halogen (—F, —Cl, —Br, or —I), a hydroxy group (—OH), a nitro group (—NO$_2$), a cyano group (—CN), an amino group or amine group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H), or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

Herein, "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 (or C15) cycloalkenyl group, a C3 (or C6) to C30 cycloalkynyl group, or a C2 to C30 heterocycloalkyl group.

As used herein, when a definition is not otherwise provided, the term "hetero" refers to inclusion of at least one (for example, one to three) heteroatoms selected from, N, O, S, Si, and P.

As used herein, "alkylene group" refers to a straight or branched saturated aliphatic hydrocarbon group having at least two valences and optionally substituted with at least one substituent. As used herein, "arylene group" refers to a functional group having at least two valences obtained by removal of at least two hydrogens in at least one aromatic ring, and optionally substituted with at least one substituent.

In addition, "aliphatic organic group" refers to a C1 to C30 linear or branched alkyl group, "aromatic organic group" refers to a C6 to C30 aryl group or a C2 to C30 heteroaryl group, and "alicyclic organic group" refers to a C3 to C30 cycloalkyl group, a C3 to C30 cycloalkenyl group, and a C3 to C30 cycloalkynyl group.

As used herein, "(meth)acrylate" refers to acrylate and/or methacrylate.

Herein, a blue light conversion rate (blue light conversion efficiency: CE) is a ratio of a light emission amount of a quantum dot-polymer composite relative to absorbed light amount of the quantum dot-polymer composite from excitation light (for example, blue light). The total light amount (B) of excitation light is obtained by integrating a PL spectrum, the PL spectrum of the quantum dot (polymer) composite film is measured, a light amount (A) in a green or red wavelength emitted from the quantum dot (polymer) composite film and a light amount (B') of excitation light are obtained, and a blue light conversion rate and a blue light absorption rate is obtained by the following equation:

$$[A/(B-B')] \times 100\% = \text{blue light conversion rate (\%)}$$

$$[(B-B')/B] \times 100\% = \text{blue light absorption rate (\%) of single film}$$

In an embodiment, "dispersion" may refer to dispersion wherein a dispersed phase is a solid and a continuous phase includes a liquid or a solid. In an embodiment, "dispersion" may refer to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., about 2 μm or less or about 1 μm or less).

As used herein, the term "group" refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Rb, and Cs, but are not limited thereto.

As used herein, "Group V" refers to Group VA, and examples thereof may include nitrogen, phosphorus, arsenic, antimony, and bismuth, but are not limited thereto.

As used herein, "Group VI" refers to Group VIA, and examples thereof may include sulfur, selenium, and tellurium, but are not limited thereto.

The wording "average" used in this specification (e.g., an average size of the quantum dot) may be mean or median. In an embodiment, the average may be "mean" average.

As used herein, the quantum efficiency may be a quantum yield that can be readily measured by any commercially available equipment. The quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on their PL wavelengths, but are not limited thereto.

The quantum yield may be readily and reproducibly determined by using commercially available equipment, for example, from Hitachi Co. Ltd or Hamamatsu Co. Ltd and referring to the instruction manuals provided from the manufacturer.

The FWHM and the maximum PL peak wavelength may be determined by a photoluminescent spectrum obtained by a spectrophotometer (or Fluorescence Spectrophotometer).

As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other harmful heavy metal) may be present or, if present, an amount of cadmium (or other harmful heavy metal) may be less than or equal to a detection limit or as an impurity level of a given analysis tool (e.g., an inductively coupled plasma atomic emission spectroscopy).

As used herein, the "first absorption peak wavelength" refers to a wavelength of the first main peak appearing in the lowest energy region in a UV-Vis absorption spectrum.

Quantum dots (or semiconductor nanocrystal particles) are crystalline semiconductor materials with a nanoscale size. The quantum dots have a large surface area per unit volume due to the very small particle size, and thus, exhibits a quantum confinement effect and (e.g., optical) properties that differ from those of bulk materials having the same elemental composition. The quantum dots absorb light from an excitation source and then emits light corresponding to a band gap energy of the quantum dot. The quantum dots may emit light having theoretical quantum efficiency (or QY) of about 100% and high color purity (e.g., less than or equal to about 40 nm of a full width at half maximum (FWHM)) and thus achieve increased luminous efficiency and improved color reproducibility.

The quantum dots have unique luminescence properties and have a potential to be applied as luminescent materials in various devices (e.g., electronic devices). The quantum dot-based light emitting device may provide improved display quality in terms of color purity, luminance, and the like. A liquid crystal display (hereinafter, LCD) is liquid crystal display (hereinafter, LCD) realizes colors by polarized light passing an absorption type color filter after passing a liquid crystal. However, LCD has a problem of a narrow viewing angle and low light transmittance due to the absorption type color filter. Accordingly, the adoption of a quantum dot-based photoluminescent type color filter rather than an absorption color filter in a LCD may provide opportunity of a wider viewing angle and improved luminance. The quantum dots may be dispersed in a host matrix (e.g., including a polymer and/or an inorganic material) to form a quantum dot composite that is then applied to an LCD.

In order to be used in a photoluminescent type color filter, a quantum dot having improved luminescence properties (e.g., increased light conversion rate, etc.) as well as stability (e.g., capable of maintaining luminescence properties during a patterning process) is desired or of interest. An amount (or a weight percentage) of quantum dots that may be included in the quantum dot composite may be limited for various reasons. Accordingly, quantum dots included in a given weight and capable of exhibiting improved luminance/light conversion rate and exhibiting increased thermal stability is desired or of interest.

Presently, a majority of quantum dots that exhibit optical properties applicable to an electronic device such as for a display device are cadmium-based or cadmium-containing quantum dots. However, cadmium is an element that raises serious environment/health issues and is one of restricted elements under Restriction of Hazardous Substances Directive (RoHS) in many countries. Accordingly, development of a cadmium-free quantum dot having improved photoluminescence characteristics is desired and of interest.

A Group III-V-based nanocrystal may be one of non-cadmium-based (cadmium-free) quantum dots. The Group III-V quantum dot such as an indium phosphide (InP)-based quantum dot is very susceptible to surface oxidation and may exhibit insufficient stability (e.g., chemical stability and thermal stability) compared with that of cadmium-based quantum dots. For example, a process for applying a cadmium-free quantum dot to an electronic device may result in a significant deterioration of its luminescent properties. To address this as well as other technical issues, attempts have been made to passivate indium phosphide-containing cores with a ZnSe/ZnS multi-layered shell positioned about the core to increase quantum efficiency and stability (e.g., in a photoresist composition including the core-shell quantum dots). However, the present inventors have found that the many such attempts may not accomplish a desired or necessary level of improvement in luminescent properties. Without wishing to be bound by any theory, this is because the InP core as a light emitting center is very susceptible to oxidation and tends to have a large number of surface defects in comparison with cadmium-based core quantum dots. Accordingly, there may exist a technical threshold to improving luminescence properties by the presence and use of a multi-layered shell. Moreover, for core-shell quantum dots (particularly, in a form of a polymer composite including the core-shell quantum dots and the like) to emit green light in a desired wavelength range, an indium phosphide core having a relatively smaller size may be required, but a smaller sized core may result in an increased surface area relative to a volume, i.e., an increase number of surface defects per a unit volume. Accordingly, one potential solution to improve upon the luminescence properties of a cadmium-free quantum dot may cause other issues that detrimentally impact such properties. In summary, the synthesis of core-shell quantum dots capable of emitting green light in a desired wavelength range with improved efficiency and stability is a very challenging technical problem with no easy solution.

Core-shell quantum dots having an indium phosphide-based core and a Zn, Se, and S-based shell may not achieve the necessary improved quality (e.g., a uniform shell) due to substantial oxidation of the InP core surface and the resulting surface defects before or during the formation of the shell. A thickness of the shell layer may be increased to secure coating uniformity, but quantum dots obtained from such an effort may not be desirable for use as a quantum dot color filter because a high absorption rate per a quantum dot is deemed necessary, and an increase in thickness of the shell layer is likely to decrease absorption rate. Accordingly, the research and development of quantum dots having a relatively thin shell, which would include a greater number of quantum dots per unit weight, and exhibit luminous efficiency and stability at the desired level (e.g., applicable to the quantum dot color filter) is needed and of urgent interest.

A quantum dot-polymer composite of an embodiment includes core-shell quantum dots that will be described hereinbelow and thus may emit green light in a desired wavelength range with increased efficiency (e.g., quantum efficiency and/or a blue light conversion rate).

The quantum dot-polymer composite (or the core-shell quantum dots included therein) according to an embodiment do not include cadmium (e.g., are cadmium-free). The quantum dot polymer composite (or the core-shell quantum dots) may emit light having a maximum peak in a green light wavelength region (e.g., when excited by blue light having a predetermined wavelength.

The blue light (excitation light) may have a center wavelength of greater than or equal to about 445 nm, greater than or equal to about 450 nm, greater than or equal to about 455 nm and less than or equal to about 470 nm, less than or equal to about 465 nm, less than or equal to about 460 nm, or less than or equal to about 455 nm. The center wavelength of the blue light may be 458 nm.

The green light wavelength region (maximum emission peak wavelength region) may be greater than or equal to about 500 nm, for example, greater than or equal to about 505 nm, greater than or equal to about 510 nm, greater than or equal to about 515 nm, greater than or equal to about 520 nm, greater than or equal to about 525 nm, greater than or equal to about 530 nm, or greater than or equal to about 535 nm. The green light wavelength region may be less than or equal to about 560 nm, for example, less than or equal to about 550 nm, less than or equal to about 545 nm, less than or equal to about 540 nm, less than or equal to about 539 nm, less than or equal to about 538 nm, less than or equal to about 537 nm, less than or equal to about 536 nm, less than or equal to about 535 nm, less than or equal to about 534 nm, less than or equal to about 533 nm, less than or equal to about 532 nm, less than or equal to about 531 nm, less than or equal to about 530 nm, less than or equal to about 529 nm, less than or equal to about 528 nm, less than or equal to about 527 nm, less than or equal to about 526 nm, less than or equal to about 525 nm, less than or equal to about 524 nm, less than or equal to about 523 nm, less than or equal to about 522 nm, less than or equal to about 521 nm, or less than or equal to about 520 nm.

A quantum dot-polymer composite according to an embodiment includes a polymer matrix; and core-shell quantum dots (hereinafter, at times also referred to as quantum dots) dispersed in the polymer matrix.

The quantum dots include core-shell quantum dots including a semiconductor nanocrystal core including indium (In), zinc (Zn), and phosphorus (P), a semiconductor nanocrystal shell disposed on the semiconductor nanocrystal core, the semiconductor nanocrystal shell including zinc, selenium, and sulfur. In the core-shell quantum dot, a mole ratio (P:In) of phosphorus to indium is greater than or equal to about 0.75:1, and a mole ratio (Zn:In) of zinc to indium is greater than or equal to about 35:1.

The mole ratios between quantum dot component elements in the present specification may be determined by any method. In an embodiment, mole amounts or mole ratios of quantum dot elements may be confirmed by inductively coupled plasma atomic emission analysis, X-ray photoelectron spectroscopy (XPS), or electron energy loss spectroscopy (EELS).

In an embodiment, the quantum dots may have a core multi-layered shell structure having a core including InZnP, a first shell layer disposed directly on the core and including ZnSe, and a second shell layer disposed directly on the first shell layer and including ZnS. A size of the core may be greater than or equal to about 1 nanometer (nm), greater than or equal to about 1.5 nm, or greater than or equal to about 2 nm. For example, the size of the core may be less than or equal to about 4 nm, less than or equal to about 3 nm, or less than about 2.7 nm (e.g., less than or equal to about 2.5 nm). As used herein, a size may refer to a size of a single particle or an average size of particles.

The core-shell quantum dot includes a ternary component core of InZnP. The core of the embodiment may exhibit a reduced level of defects, and thus may achieve an improved level of light conversion rate in the presence of a shell layer, or a multi-layered shell, and which is then used in the preparation of a quantum dot polymer composite. In an embodiment, the InZnP ternary component core may have a layered structure of InP/InZnP/InP, and thus, in the core a concentration gradient of Zn may increase and then decrease from the center of the core toward the surface of the core.

Without wishing to be bound by any theory, as the core-shell quantum dot(s) of an embodiment may have a core having the above structural characteristics, it (or they) may have a composition described herein and thus may exhibit improved luminescence properties even when a size of the core is relatively small.

Without wishing to be bound by any theory, the core included in the core-shell quantum dot of an embodiment is manufactured in a method that will be described below and thus may have the aforementioned structural characteristics including less surface defects or improved resistance against oxidation during shell formation (e.g., washing and the like), and thus, the core-shell quantum dot may exhibit improved luminescence properties.

In the core-shell quantum dot included in the composite of an embodiment, a mole ratio of phosphorus to indium may be greater than or equal to about 0.75:1, greater than or equal to about 0.76:1, greater than or equal to about 0.77:1, greater than or equal to about 0.78:1, greater than or equal to about 0.79:1, greater than or equal to about 0.8:1, greater than or equal to about 0.81:1, greater than or equal to about 0.82:1, greater than or equal to about 0.83:1, greater than or equal to about 0.84:1, greater than or equal to about 0.85:1, greater than or equal to about 0.86:1, greater than or equal to about 0.87:1, greater than or equal to about 0.88:1, greater than or equal to about 0.89:1, greater than or equal to about 0.9:1, greater than or equal to about 0.91:1, greater than or equal to about 0.92:1, greater than or equal to about 0.93:1, greater than or equal to about 0.94:1, greater than or equal to about 0.95:1, greater than or equal to about 0.96:1, greater than or equal to about 0.97:1, greater than or equal to about 0.98:1, or greater than or equal to about 0.99:1. The mole ratio of phosphorus to indium may be less than or equal to about 1.5, less than or equal to about 1.4:1, less than or equal to about 1.3:1, less than or equal to about 1.2:1, less than or equal to about 1.19:1, less than or equal to about 1.18:1, less than or equal to about 1.17:1, less than or equal to about 1.16:1, less than or equal to about 1.15:1, less than or equal to about 1.14:1, less than or equal to about 1.13:1, less than or equal to about 1.12:1, less than or equal to about 1.11:1, less than or equal to about 1.1:1, less than or equal to about 1.09:1, less than or equal to about 1.08:1, less than or equal to about 1.07:1, less than or equal to about 1.06:1, less than or equal to about 1.05:1, less than or equal to about 1.04:1, less than or equal to about 1.03:1, less than or equal to about 1.02:1, less than or equal to about 1.01:1, less than or equal to about 1:1, less than or equal to about 0.99:1, less than or equal to about 0.98:1, less than or equal to about 0.97:1, less than or equal to about 0.96:1, less than or equal to about 0.95:1, less than or equal to about 0.94:1, less than or equal to about 0.93:1, less than or equal to about 0.92:1, less than or equal to about 0.91:1, less than or equal to about 0.9:1, less than or equal to about 0.89:1, less than or equal to about 0.88:1, less than or equal to about 0.87:1, less than or equal to about 0.86:1, less than or equal to about 0.85:1, less than or equal to about 0.84:1, less than or equal to about 0.83:1, less than or equal to about 0.82:1, less than or equal to about 0.81:1, or less than or equal to about 0.8:1.

In the core-shell quantum dot, a mole ratio of zinc to indium may be greater than or equal to about 35:1, greater than or equal to about 36:1, greater than or equal to about 37:1, greater than or equal to about 38:1, greater than or equal to about 39:1, greater than or equal to about 40:1, greater than or equal to about 41:1, greater than or equal to about 42:1, greater than or equal to about 43:1, greater than or equal to about 44:1, greater than or equal to about 45:1, greater than or equal to about 46:1, greater than or equal to about 47:1, greater than or equal to about 48:1, greater than or equal to about 49:1, or greater than or equal to about 50:1. The mole ratio of zinc to indium may be less than or equal to about 60:1, less than or equal to about 55:1, less than or equal to about 54:1, less than or equal to about 53:1, less than or equal to about 52:1, less than or equal to about 51:1, less than or equal to about 50:1, less than or equal to about 49:1, less than or equal to about 48:1, less than or equal to about 47:1, less than or equal to about 46:1, or less than or equal to about 45:1.

In core-shell quantum dots of an embodiment, a mole ratio of sulfur to selenium may be less than or equal to about 1:1, less than or equal to about 0.9:1, less than or equal to about 0.8:1, less than or equal to about 0.7:1, less than or equal to about 0.65:1, less than or equal to about 0.61:1, or less than or equal to about 0.6:1. In quantum dots of an embodiment, mole ratio of sulfur to selenium may be greater than or equal to about 0.1:1, greater than or equal to about 0.2:1, greater than or equal to about 0.3:1, greater than or equal to about 0.4:1, or greater than or equal to about 0.5:1.

In the core-shell quantum dots, a mole ratio [(Se+S):In] of a sum of sulfur and selenium to indium may be greater than or equal to about 10:1, greater than or equal to about 15:1, greater than or equal to about 19:1, greater than or equal to about 20:1, greater than or equal to about 21:1, greater than or equal to about 22:1, greater than or equal to about 23:1, greater than or equal to about 24:1, greater than or equal to about 25:1, greater than or equal to about 26:1, greater than or equal to about 27:1, greater than or equal to about 28:1, greater than or equal to about 29:1, or greater than or equal to about 30:1. The mole ratio [(Se+S):In] of the sum of sulfur and selenium to indium may be less than or equal to about 45:1, less than or equal to about 44:1, less than or equal to about 43:1, less than or equal to about 42:1, less than or equal to about 41:1, less than or equal to about 40:1, less than or equal to about 39:1, less than or equal to about 38:1, less than or equal to about 37:1, less than or equal to about 36:1, less than or equal to about 35:1, less than or equal to about 34:1, less than or equal to about 33:1, or less than or equal to about 32:1.

In core-shell quantum dots of an embodiment, the semiconductor nanocrystal shell may include a first shell layer including zinc and selenium and a second shell layer including zinc and sulfur disposed on the first shell layer. The first shell layer may be disposed directly on the core. The first shell layer may include ZnSe, ZnSeS, or a combination thereof. The first shell layer may not include sulfur (S). The core-shell quantum dots may not include gallium.

In an embodiment, a thickness of the first shell layer is 3 or more monolayers (ML), for example, 3.5 ML or more, 3.6 ML or more, 3.7 ML or more, 3.8 ML or more, 3.9 ML or more, or 4 ML or more. The thickness of the first shell layer may be about 7 ML or less, for example, about 6 ML or less, or about 5 ML or less. In an embodiment, a thickness of the first shell layer may be greater than or equal to about 0.9 nm, greater than or equal to about 1 nm, greater than or equal to about 1.1 nm, or greater than or equal to about 1.2 nm and less than or equal to about 1.4 nm, less than or equal to about 1.3 nm, or less than or equal to about 1.25 nm.

The second shell layer may include ZnS. The second shell layer may not include selenium. The second shell layer may be disposed directly on the first shell layer. The second shell layer may be the outermost layer of the quantum dots. A thickness of the second shell layer may be less than about 0.7 nm, for example, less than or equal to about 0.65 nm, less than or equal to about 0.64 nm, less than or equal to about 0.63 nm, less than or equal to about 0.62 nm, less than or equal to about 0.61 nm, less than or equal to about 0.6 nm, less than or equal to about 0.59 nm, or less than or equal to about 0.58 nm.

The thickness of the second shell layer may be greater than or equal to about 0.15 nm, greater than or equal to about 0.16 nm, greater than or equal to about 0.17 nm, greater than or equal to about 0.18 nm, greater than or equal to about 0.19 nm, greater than or equal to about 0.2 nm, greater than or equal to about 0.21 nm, greater than or equal to about 0.22 nm, greater than or equal to about 0.23 nm, greater than or equal to about 0.24 nm, greater than or equal to about 0.25 nm, greater than or equal to about 0.26 nm, or greater than or equal to about 0.27 nm.

In a UV-Vis absorption spectrum of the core-shell quantum dots or quantum dot-polymer composite including quantum dots according to embodiments described herein, a valley depth (VD) defined by the following equation may be equal to or greater than 0.3 (e.g., greater than or equal to about 0.4, greater than about 0.4, greater than or equal to about 0.42, greater than or equal to about 0.43, greater than or equal to about 0.44, greater than or equal to about 0.45, greater than or equal to about 0.46, greater than or equal to about 0.47, greater than or equal to about 0.48, greater than or equal to about 0.49, or greater than or equal to about 0.5).

$$1-(Abs_{valley}/Abs_{first})=VD$$

Herein, $Abs_{first}$ is an absorption rate (e.g., absorption intensity) (a) at the first absorption peak and $Abs_{valley}$ is an absorption rate (b) at the lowest point of the valley adjacent to the first absorption peak.

In the present specification, the valley of the UV-Vis absorption spectrum refers to a portion (2) in which a tangent slope of the UV-Vis absorption spectrum curve changes from a negative value to a positive value as a wavelength increases and the portion (2) is adjacent to the first absorption peak (1). See, FIG. 1.

In the UV-Vis absorption spectrum of the core-shell quantum dot(s) (or composites including the same), the first absorption peak may be present in a range of greater than about 450 nm and less than a maximum photoluminescence peak wavelength. The first absorption peak may be greater than or equal to about 455 nm, for example, greater than or equal to about 460 nm, greater than or equal to about 465 nm, greater than or equal to about 470 nm, greater than or equal to about 475 nm, greater than or equal to about 480 nm, greater than or equal to about 485 nm, or greater than or equal to about 490 nm and less than or equal to about 520 nm, less than or equal to about 515 nm, or less than or equal to about 510 nm.

The valley (or the lowest point of the valley) adjacent to the first absorption peak may be present in a wavelength range of greater than or equal to about 420 nm, for example, greater than or equal to about 425 nm, greater than or equal to about 430 nm, or greater than or equal to about 440 nm and less than or equal to about 490 nm, for example, less than or equal to about 495 nm, less than or equal to about 480 nm, less than or equal to about 475 nm, or less than or equal to about 470 nm.

The core-shell quantum dots of an embodiment may form a population having an improved size distribution. The quantum dot population includes the core-shell quantum dots including the semiconductor nanocrystal core including indium (In), zinc (Zn), and phosphorus (P), and the semiconductor nanocrystal shell disposed on the semiconductor nanocrystal core, the shell including zinc, selenium, and sulfur, the core-shell quantum dots do not include cadmium, the core-shell quantum dots have a mole ratio of phosphorus to indium of greater than or equal to about 0.75:1 and less than or equal to about 1.5:1 (or less than or equal to about 1.2:1), the core-shell quantum dots have a mole ratio of zinc to indium of greater than or equal to about 33:1, the core-shell quantum dots are configured to emit green light, and the green light has a maximum luminescence peak wavelength of less than or equal to about 550 nm or less than or equal to about 540 nm.

The maximum luminescence peak wavelength of the green light may be less than or equal to about 545 nm, less than or equal to about 540 nm, less than or equal to about 535 nm, less than or equal to about 530 nm, less than or equal to about 525 nm, or less than or equal to about 520 nm. The maximum luminescence peak wavelength of the green light may be greater than or equal to about 500 nm, greater than or equal to about 505 nm, or greater than or equal to about 510 nm.

The core-shell quantum dots may have a mole ratio of phosphorus to indium as described above. In the core-shell quantum dots, a mole ratio of phosphorus to indium may be greater than or equal to about 0.8, greater than or equal to about 0.82, greater than or equal to about 0.84, greater than or equal to about 0.86, greater than or equal to about 0.88, greater than or equal to about 0.9, greater than or equal to about 0.92, or greater than or equal to about 0.94. In the core-shell quantum dots, the mole ratio of phosphorus relative to indium may be less than or equal to about 1.1, less than or equal to about 1.08, less than or equal to about 1.06, less than or equal to about 1.04, less than or equal to about 1.02, less than or equal to about 1, less than or equal to about 0.98, less than or equal to about 0.96, less than or equal to about 0.94, less than or equal to about 0.92, less than or equal to about 0.9, less than or equal to about 0.88, or less than or equal to about 0.86.

The core-shell quantum dots may have a mole ratio of zinc to indium as described above. In the core-shell quantum dots of an embodiment, the mole ratio of zinc relative to indium may be greater than or equal to about 38, greater than or equal to about 39, greater than or equal to about 40, greater than or equal to about 41, greater than or equal to about 42, or greater than or equal to about 43. In core-shell quantum dots of an embodiment, the mole ratio of zinc relative to indium may be less than or equal to about 50, less than or equal to about 49, less than or equal to about 48, less than or equal to about 47, less than or equal to about 46, less than or equal to about 45, less than or equal to about 44, less than or equal to about 43, less than or equal to about 42, or less than or equal to about 41.

The core-shell quantum dots may have a mole ratio of sulfur relative to selenium as described above. In core-shell quantum dots of an embodiment, the mole ratio of sulfur relative to selenium may be less than or equal to about 0.8, less than or equal to about 0.7, less than or equal to about 0.6, less than or equal to about 0.5, or less than or equal to about 0.4. In core-shell quantum dots of an embodiment, the mole ratio of sulfur relative to selenium may be greater than or equal to about 0.1, greater than or equal to about 0.15, greater than or equal to about 0.2, greater than or equal to about 0.25, or greater than or equal to about 0.3.

In the quantum dot population the core-shell quantum dot(s) may have a size (or average size) of greater than or equal to about 1 nm, greater than or equal to about 2 nm, greater than or equal to about 3 nm, greater than or equal to about 4 nm, or greater than or equal to about 5 nm. The core-shell quantum dot(s) may have a (average) size of less than or equal to about 30 nm, for example, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, or less than or equal to about 7 nm. The size of the quantum dots may be a particle size. The size of the quantum dots (if not spherical) may be a diameter calculated by converting a two-dimensional area identified by transmission electron microscopy to a circle.

In the quantum dot population, the quantum dots may have a standard deviation of less than or equal to about 17%, less than or equal to about 16%, less than or equal to about 15%, or less than or equal to about 14% of an average size.

The shapes of the quantum dots are not particularly limited, may for example be a spherical, polyhedron, pyramid, multipod, or cube shape, nanotube, nanowire, nanofiber, nanosheet, or a combination thereof, but are not limited thereto.

The core-shell quantum dots of an embodiment may have a quantum yield of greater than or equal to about 75%, greater than or equal to about 80%, greater than or equal to about 85%, greater than or equal to about 86%, greater than or equal to about 87%, greater than or equal to about 88%, greater than or equal to about 89%, greater than or equal to about 90%, or greater than or equal to about 95%.

The core-shell quantum dots of an embodiment may have a full width at half maximum (FWHM) of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, or less than or equal to about 35 nm, less than or equal to about 34 nm, less than or equal to about 33 nm, less than or equal to about 32 nm, less than or equal to about 31 nm, or less than or equal to about 30 nm. The quantum dot may have a full width at half maximum (FWHM) of from about 5 nm to about 40 nm, for example, from about 10 nm to about 35 nm, from about 15 nm to about 30 nm, or from about 18 nm to about 25 nm. The core-shell quantum dot (s) may include an organic ligand described later and/or an organic solvent described later on the surface. The organic ligand and/or the organic solvent may be bound to the surfaces of the quantum dots.

In photoluminescence spectroscopy measured at 77K of the core-shell quantum dots, a ratio of a peak area of greater than or equal to about 650 nm relative to an area of a maximum emission peak (hereinafter referred to as a deep trap ratio) may be less than or equal to about 4%, less than or equal to about 3%, or less than or equal to about 2%. The photoluminescence analysis may be performed using a 400 nm light source. In the low temperature photoluminescent analysis, the deep trap peaks may be identified by conducting deconvolution of the maximum PL peak in a region apart from a center wavelength thereof by about −0.45 eV or more. The deconvolution of a peak may be easily carried out by a peak analysis tool (e.g., a commercially available software or an open-source program), which is commercially available or may be made in a well-known manner. As confirmed by the present inventors, in the case of green light emitting quantum dots, a trap presence may affect quantum dot luminescence properties (e.g., in the composite). A rate of trap emission at low temperature PL may suggest a frequency/amount of trap. The quantum dots according to an embodiment may exhibit a reduced trap emission rate, and XPS depth analysis may indicate a very limited level of P oxide content. These results may suggest that a degree of surface oxidation of the core is lowered, which may indicate a reduced trap emission rate and/or improved emission properties in the final core-shell quantum dots.

A method of producing the core-shell quantum dot(s) and the quantum dot population including the quantum dots includes preparing a semiconductor nanocrystal core including indium (In), zinc (Zn), and phosphorus (P), and in the presence of the core and the first organic ligand, reacting a zinc shell precursor and at least one of a selenium precursor or a sulfur precursor (i.e., a selenium precursor, a sulfur precursor, or a combination thereof) (e.g., in an organic solvent) to form a semiconductor nanocrystal shell including zinc, selenium, and sulfur on the semiconductor nanocrystal core.

The preparing of the semiconductor nanocrystal core includes, preparing a zinc core precursor;

preparing an indium precursor solution (or referred to as an indium precursor) by heating an indium compound in the presence of a second organic ligand and an organic solvent; optionally heating the indium precursor solution; and mixing the (optionally heated) indium precursor solution with the phosphorus precursor and the zinc core precursor simultaneously or sequentially to perform a reaction at a reaction temperature. A ratio between the precursors (and, optionally, a mixing method between them) is adjusted to obtain a quantum dot having the aforementioned composition.

A reaction temperature for forming the core may be greater than or equal to about 200° C., greater than or equal to about 230° C., greater than or equal to about 240° C., or greater than or equal to about 250° C. The reaction temperature for forming the core may be less than or equal to about 300° C., for example, less than or equal to about 290° C., less than or equal to about 280° C., less than or equal to about 270° C., or less than or equal to about 260° C.

In an embodiment, the mixing of the phosphorus precursor may be performed two or more times (e.g., 3 or more times and 10 or less times). In an embodiment, the mixing of the zinc core precursor may be performed two or more times (e.g., 3 or more times and 10 or less times). In an embodiment, the method may further include adding an indium precursor to the reaction mixture one, two, or more times. Without wishing to be bound by any theory, it is believed that this additional mixing method may not only control a ratio of the total precursors, but also contribute to realization of the aforementioned composition and ratio in the final quantum dots.

In this method, the shell may include a zinc selenide that is formed by a reaction of the zinc shell precursor and the selenium precursor, and/or the shell may include a zinc sulfide that is formed by a reaction of the zinc shell precursor and the sulfur precursor. In an embodiment, the shell formation may be performed by reacting the zinc shell precursor sequentially or simultaneously with the selenium precursor and sulfur precursor. Details of the types of precursors for shell formation and the like are described herein below.

In an embodiment, the zinc shell precursor and the sulfur precursor may react in the presence of an acid-base adduct and zinc halide in an organic solvent to form a zinc sulfide shell layer. When forming the shell, a ratio between the precursors may be adjusted so that the final quantum dots may have the aforementioned composition.

In an embodiment, upon reaction of the zinc shell precursor and the sulfur precursor, the zinc shell precursor may not include halogen. In this case, the shell-forming reaction system may further include halides of additional metals and Lewis bases, and the additional metals may include aluminum, magnesium, gallium, antimony, titanium, or a combination thereof. The Lewis base may include $R_3PO$ (wherein, R is a substituted or unsubstituted C1 to C40 aliphatic hydrocarbon group, a substituted or unsubstituted C6 to C40 aromatic hydrocarbon group, or a combination thereof). During the reaction of the zinc shell precursor and the sulfur precursor, zinc halide may be additionally injected into the reaction system. The zinc halide may include zinc chloride.

A halogen-free zinc shell precursor may include dimethyl zinc, diethyl zinc, zinc acetate, zinc acetylacetonate, zinc carbonate, zinc cyanide, zinc nitrate, zinc oxide, zinc peroxide, zinc sulfate, or a combination thereof. The halogen-free zinc shell precursor may include a reaction product of a zinc compound (e.g., zinc acetate) and fatty acid (e.g., monocarboxylic acid having or more carbon atoms such as stearic acid, oleic acid, palmitic acid, lauric acid). The reaction of the zinc compound and the fatty acid may be performed for a predetermined time at a temperature of greater than or equal to about 120° C. in an organic solvent.

In this case, the sulfur precursor may be obtained by contacting sulfur with a compound (hereinafter referred to as a Lewis base compound) that may serve as a Lewis base. The Lewis base compound may include primary, secondary, or tertiary phosphine or primary, secondary, or tertiary phosphine oxide. The Lewis base compound may include $R_3P$ or $R_3PO$ (wherein, R is hydrogen or a substituted or unsubstituted C1 to C40 aliphatic hydrocarbon group, a substituted or unsubstituted C6 to C40 aromatic hydrocarbon group, or a combination thereof), or a combination thereof. Herein, in the aforementioned chemical formula, R includes hydrogen, a substituted or unsubstituted C1 to C40 (e.g., C6 or more, C7 or more, C8 or more, C9 or more, or 010 or more and C40 or less, C30 or less, C25 or less) aliphatic hydrocarbon group (e.g., alkyl, alkenyl, or alkynyl), a substituted or unsubstituted C6 to C40 aromatic hydrocarbon group, or a combination thereof. The sulfur may include elemental sulfur.

The contacting includes dispersing and/or stirring. The contacting may be performed at a temperature of greater than or equal to about 120° C., greater than or equal to about 130° C., greater than or equal to about 140° C., or greater than or equal to about 150° C. and less than or equal to about 340° C., for example, less than or equal to about 330° C., less than or equal to about 320° C., less than or equal to about 310° C., less than or equal to about 300° C., less than or equal to about 290° C., less than or equal to about 280° C., less than or equal to about 270° C., less than or equal to about 260° C., less than or equal to about 250° C., less than or equal to about 240° C., less than or equal to about 230° C., less than or equal to about 220° C., less than or equal to about 210° C., or less than or equal to about 200° C. Examples of the phosphine oxide may include trioctylphosphine oxide, triphenylphosphine oxide, diphenylphosphine oxide, or a combination thereof, but are not limited thereto. Examples of the phosphine may include trioctylphosphine, diphenylphosphine, or a combination thereof, but are not limited thereto.

Lewis acid metal halide includes the aforementioned metal. The Lewis acid metal halide may include aluminum halide, magnesium halide, gallium halide, antimony halide, titanium halide, or a combination thereof.

The Lewis base refers to a compound capable of providing an electron pair to the Lewis acid metal halide. In an embodiment, the Lewis base may include the same compound used for the formation of the sulfur precursor. The details of the Lewis base are the same as described in relation to the formation of the sulfur precursor. The Lewis base may include $R_3P$ and/or $R_3PO$ (wherein, R is hydrogen, a substituted or unsubstituted C1 to C40 (e.g., C6 or more, C7 or more, C8 or more, C9 or more, or 010 or more and C40 or less, C30 or less, or C25 or less) aliphatic hydrocarbon group (e.g., alkyl, alkenyl, alkynyl), a substituted or unsubstituted C6 to C40 aromatic hydrocarbon group, or a combination thereof).

The Lewis acid metal halide and the Lewis base react to form an acid-base adduct Reaction conditions are not particularly limited and may be appropriately selected. A reaction temperature may be greater than or equal to about 30° C., for example, greater than or equal to about 40° C., greater than or equal to about 50° C., greater than or equal to about 60° C., greater than or equal to about 70° C., greater than or equal to about 80° C., greater than or equal to about 90° C., greater than or equal to about 100° C. and less than or equal to about 300° C., less than or equal to about 200° C., less than or equal to about 150° C., less than or equal to about 140° C., less than or equal to about 130° C., less than or equal to about 120° C., or less than or equal to about 110° C.

When used, a content of the zinc halide (zinc chloride) may be greater than or equal to about 10 mole percent (mol %), greater than or equal to about mol %, greater than or equal to about 30 mol %, or greater than or equal to about 40 mol % and less than or equal to about 100 mol %, less than or equal to about 90 mol %, less than or equal to about 80 mol %, or less than or equal to about 70 mol % relative to the sulfur precursor. When used, a content of Lewis metal halide may be greater than or equal to about 10 mol %, greater than or equal to about 20 mol %, greater than or equal to about 30 mol %, or greater than or equal to about 40 mol % and less than or equal to about 100 mol %, less than or equal to about 90 mol %, less than or equal to about 80 mol %, or less than or equal to about 70 mol % relative to the sulfur precursor.

In the method of an embodiment, in synthesizing a shell including Zn and S from a Zn shell precursor and an S precursor, in addition to the zinc shell precursor, a Lewis acid halide including a metal and a zinc halide may be used together. This method may form a ZnS layer (e.g., having a well-passivated or defect-free surface on the shell or outermost shell).

The type of the zinc (core/shell) precursor (hereinafter referred to as zinc precursor) is not particularly limited and may be appropriately selected. For example, the zinc precursor may be a Zn metal powder, an alkylated Zn compound, Zn alkoxide, Zn carboxylate, Zn nitrate, Zn perchlorate, Zn sulfate, Zn acetylacetonate, Zn halide, Zn cyanide, Zn hydroxide, Zn oxide, Zn peroxide, or a combination thereof. The zinc precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. The zinc precursors may be used alone or in combination of two or more. In an embodiment, the zinc core precursor may include zinc carboxylate. The zinc core precursor may be obtained by reaction of a suitable zinc compound (zinc acetate) and a carboxylic acid group-containing organic ligand compound described later.

The (first and/or second) organic ligand may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO (OH)$_2$, RHPOOH, R$_2$POOH (wherein, R and R' are independently a C1 to C40 (or C3 to C24) aliphatic hydrocarbon (e.g., alkyl group, alkenyl group alkynyl group), or C6 to C40 (or C6 to C24) aromatic hydrocarbon (e.g., C6 to C20 aryl group)), or a combination thereof. The organic ligand may coordinate the surface of the obtained nanocrystal and makes the nanocrystal to be well dispersed in the solution and/or effects on light emitting and electrical characteristics of quantum dots. Examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, oleyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; phosphine such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, substituted or unsubstituted octylphosphine (e.g., trioctylphosphine (TOP)), and the like; phosphine oxide such as substituted or unsubstituted methyl phosphine oxide (e.g., trimethyl phosphine oxide, methyldiphenyl phosphine oxide, etc.), substituted or unsubstituted ethyl phosphine oxide(e.g., triethyl phosphine oxide, ethyldiphenylphosphine oxide, etc.), substituted or unsubstituted propyl phosphine oxide, substituted or unsubstituted butyl phosphine oxide, substituted or unsubstituted octylphosphine oxide (e.g., trioctylphosphine oxide (TOPO), and the like; a diphenyl phosphine, triphenyl phosphine, or an oxide compound thereof; C5 to C20 alkylphosphinic acid, or C5 to C20 alkyl phosphonic acid such as phosphonic acid, hexylphosphinic acid, octylphosphinic acid, dodecanephosphinic acid, tetradecanephosphinic acid, hexadecanephosphinic acid, octadecanephosphinic acid, and the like; but are not limited thereto. The organic ligand may be used alone or as a mixture of two or more.

The organic solvent may be selected from C6 to C22 primary amine such as hexadecylamine; C6 to C22 secondary amine such as dioctylamine; C6 to C40 tertiary amine such as trioctylamine; a nitrogen-containing heterocyclic compound such as pyridine; C6 to C40 aliphatic hydrocarbon (e.g., alkane, alkene, alkyne, etc.) such as hexadecane, octadecane, octadecene, or squalane; C6 to C30 aromatic hydrocarbon such as phenyldodecane, phenyltetradecane, or phenyl hexadecane; phosphine substituted with a C6 to C22 alkyl group such as trioctylphosphine; phosphine oxide substituted with a C6 to C22 alkyl group such as trioctylphosphine oxide; C12 to C22 aromatic ether such as phenyl ether, or benzyl ether, and a combination thereof. Types and contents of the solvent may be appropriately selected considering precursors and organic ligands.

Types of the indium compound are not particularly limited and may be appropriately selected. The indium compounds may include an indium powder, an alkylated indium compound, indium alkoxide, indium acetate, indium carboxylate, indium nitrate, indium perchlorate, indium sulfate, indium acetylacetonate, indium halide (e.g., indium chloride), indium cyanide, indium hydroxide, indium oxide, indium peroxide, indium carbonate, or a combination thereof. The indium compound is heated in the presence of the organic ligand to obtain an indium precursor. In order to form the indium precursor, an indium compound and an organic ligand may be heated in an organic solvent, at a temperature of for example, greater than or equal to about 100° C., greater than or equal to about 120° C., greater than or equal to about 150° C., greater than or equal to about 200° C., greater than or equal to about 250° C., or greater than or equal to about 270° C., under a vacuum and/or inert atmosphere.

The type of the phosphorus precursor is not particularly limited and may be appropriately selected. The phosphorus precursor may include tris(trimethylsilyl) phosphine, tris (dimethylamino) phosphine, triethylphosphine, tributylphosphine, trioctylphosphine, triphenylphosphine, tricyclohexylphosphine, or a combination thereof.

The mixture obtained by injecting the phosphorus precursor during the core formation process may be heated to a temperature of greater than or equal to about 50° C., greater than or equal to about 60° C., or greater than or equal to about 100° C. and less than or equal to about 300° C., less than or equal to about 280° C., or less than or equal to about 260° C.

The core formation reaction time is not particularly limited, and may be appropriately selected in consideration of reactivity between precursors and core formation temperature. The core formation reaction time may be greater than or equal to about 10 minutes and less than or equal to about 60 minutes.

The selenium precursor is not particularly limited and may be desirably selected. For example, the selenium precursor includes selenium-trioctyl phosphine (Se-TOP), selenium-tributyl phosphine (Se-TBP), selenium-triphenyl phosphine (Se-TPP), selenium-diphenyl phosphine (Se-DPP), or a combination thereof, but is not limited thereto. In the shell formation process, the selenium precursor may be injected once or more (e.g., twice or more).

The sulfur precursor is not particularly limited and may be appropriately selected. In an embodiment, the sulfur precursor may include thiol. In another embodiment, the sulfur precursor may not include a thiol. The sulfur precursor may include mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, or a combination thereof. The sulfur precursor may be injected once or more (e.g., twice or more).

The shell formation temperature may be appropriately selected. In an embodiment, a shell formation temperature may be greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., greater than or equal to about 290° C., greater than or equal to about 300° C., greater than or equal to about 310° C., or greater than or equal to about 315° C. In an embodiment, the shell formation temperature may be less than or equal to about 350° C., less than or equal to about 340° C., less than or equal to about 330° C., or less than or equal to about 325° C.

A shell formation reaction time is not particularly limited and may be appropriately selected. For example, the shell formation reaction may be performed, for example, for greater than or equal to about 10 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, greater than or equal to about 50 minutes, greater than or equal to about 55 minutes, or greater than or equal to about 1 hour, but is not limited thereto. The shell formation reaction time may be is less than or equal to about 3 hours, and each precursor/compound may be added in a single step or several times. When the precursors or the like are added in stages, the reaction may be performed in each step for a predetermined time (e.g., greater than or equal to about 5 minutes, greater than or equal to about 10 minutes, or greater than or equal to about 15 minutes). The reaction may be performed in an inert gas atmosphere or in air, or in a vacuum, but is not limited thereto.

When the nonsolvent is added into the obtained final reaction solution, the organic ligand-coordinated nanocrystal may be separated (e.g. precipitated). The nonsolvent may be a polar solvent that is miscible with the organic solvent used in the reaction and nanocrystals are not dispersible therein. The nonsolvent may be selected depending on the organic solvent used in the reaction and may be for example, acetone, ethanol, butanol, isopropanol, ethanediol, water, tetrahydrofuran (THF), dimethylsulfoxide (DMSO), diethyl ether, formaldehyde, acetaldehyde, a solvent having a similar solubility parameter to the foregoing solvents, or a combination thereof. The separation may be performed through a centrifugation, precipitation, chromatography, or distillation. The separated nanocrystal may be added to a washing solvent and washed, if necessary. The washing solvent has no particular limit and may have a similar solubility parameter to that of the organic ligand and may, for example, include hexane, heptane, octane, chloroform, toluene, cyclohexane, cyclohexyl acetate, benzene, and the like.

In the composite of an embodiment, the aforementioned quantum dots are dispersed in the polymer matrix. The polymer matrix may include at least one of a dispersing agent (e.g., a binder polymer including a carboxylic acid group), a polymerization product (e.g., insulating polymer) of a polymerizable monomer having a carbon-carbon double bond (at least one, for example, at least two, at least three, at least four, or at least five), and optionally a polymerization product of the polymerizable monomer and a multiple thiol compound having at least two thiol groups at the terminal end. The quantum dot-polymer composite may further include metal oxide particulates.

The polymer matrix may include a cross-linked polymer and a dispersing agent (e.g., (carboxyl group-contained) binder polymer). The polymer matrix may not include a conjugated polymer (excepting cardo resin). The crosslinked polymer may include a thiolene resin, a cross-linked poly(meth)acrylate, or a combination thereof. In an embodiment, the crosslinked polymer may be a polymerization product of a polymerizable monomer and optionally a multiple thiol compound.

Descriptions for the dispersing agent or binder polymer, polymerizable monomer, and multiple thiol compound are the same as described later, in relation to the composition. The content of the quantum dots and the content of the metal oxide particulates in the composite may be the content (based on solids) in relation to the composition described later. In the composite, the content of the polymer matrix may be greater than or equal to about 3 weight percent (wt %), greater than or equal to about 5 wt %, greater than or equal to about 10 wt %, greater than or equal to about 15 wt %, or greater than or equal to about 20 wt % and less than or equal to about 97 wt %, less than or equal to about 95 wt %, less than or equal to about 90 wt %, less than or equal to about 80 wt %, or less than or equal to about 70 wt % based on a total weight of the composite.

The film of the quantum dot-polymer composite (or pattern that will be described later) may have for example a thickness of less than or equal to about 30 µm (micrometers), for example, less than or equal to about 25 um (micrometers), less than or equal to about 20 um, less than or equal to about 15 um, less than or equal to about 10 um, less than or equal to about 8 um, or less than or equal to about 7 um and greater than or equal to about 2 um, for example, greater than or equal to about 3 um, greater than or equal to about 3.5 um, greater than or equal to about 4 um, greater than or equal to about 5 um, or greater than or equal to about 6 um.

The quantum dot-polymer composite, by including the aforementioned core-shell quantum dots, may increase quantum efficiency. The quantum dot-polymer composite may have quantum efficiency of greater than or equal to about 80%, greater than or equal to about 81%, greater than or equal to about 82%, greater than or equal to about 83%, greater than or equal to about 84%, or greater than or equal to about 85%.

The quantum dot-polymer composite may have a blue light conversion rate (blue light conversion efficiency) of greater than or equal to about 35%, greater than or equal to about 36%, or greater than or equal to about 37% after heat treatment at 180° C. for 30 minutes.

The composition of an embodiment includes (e.g., a plurality of) the aforementioned core-shell quantum dots; a dispersing agent (e.g., carboxylic acid group-containing binder polymer); and a (organic) solvent. The composition may further include a photopolymerizable monomer including a carbon-carbon double bond and optionally (thermal or photo) initiator.

The content of the aforementioned quantum dot in the composition may be appropriately adjusted considering a desirable final use (e.g., color filter, etc.). In an embodiment, the content of the quantum dot may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a solid content of the composition. The content of the quantum dot may be less than or equal to about 70 wt %, for example, less than or equal to about 65 wt %, less than or equal to about 60 wt %, less than or equal to about 55 wt %, or less than or equal to about 50 wt % based on a solid content of the composition. The solid content of the present specification composition may represent the content of the corresponding component in the composite to be described later.

The composition according to an embodiment may be used to produce a quantum dot-polymer composite pattern. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing). The composition according to an embodiment may not include a conjugated polymer (except a cardo binder that will be described later). The composition according to an embodiment may include a conjugated polymer. Herein, the conjugated polymer refers to a polymer having a conjugation double bond in its main chain (e.g., polyphenylenevinylene, etc.).

The composition according to an embodiment may include a dispersing agent or a binder polymer. The binder polymer may include a carboxylic acid group (hereinafter, a carboxylic acid group-containing polymer). The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure where two aromatic rings are bound to a quaternary carbon atom that is a constituent atom of another cyclic moiety in the main chain and including a carboxylic acid group (—COOH) (hereinafter, a cardo binder); or a combination thereof.

The copolymer includes a first repeating unit derived from the first monomer and a second repeating unit derived from the second monomer, and optionally a third repeating unit derived from the third monomer.

The binder polymer including the carboxylic acid group may include a multiple aromatic ring-containing polymer. The multiple aromatic ring-containing polymer is known as a cardo binder resin and may commercially available.

The carboxylic acid group-containing polymer may have an acid value of greater than or equal to about 50 mg KOH/g. For example, the carboxylic acid group-containing polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the carboxylic acid group-containing polymer may be for example less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto. The binder polymer may have a weight average molecular weight of greater than or equal to about 1000 g/mol, for example, greater than or equal to about 2000 g/mol, greater than or equal to about 3000 g/mol, or greater than or equal to about 5000 g/mol. The binder polymer may have a weight average molecular weight of greater than or equal to about 1000 g/mol, for example, greater than or equal to about 2000 g/mol, greater than or equal to about 3000 g/mol, or greater than or equal to about 5000 g/mol.

In the composition, the content of the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on a total solid weight of the composition, but is not limited thereto. The content of the binder polymer may be less than or equal to about 55 wt %, for example less than or equal to about 40 wt %, less than or equal to about 30 wt %, less than or equal to about 33 wt %, or less than or equal to about 30 wt % based on a total solid weight of the composition.

In the composition, the polymerizable (e.g., photopolymerizable) monomer including the carbon-carbon double bond may include a (e.g., photopolymerizable) acrylic monomer (e.g., a main monomer, an auxiliary monomer, etc.).

The content of the polymerizable (e.g., photopolymerizable) monomer may be greater than or equal to about 0.5 wt %, for example, greater than or equal to about 1 wt % or greater than or equal to about 2 wt % based on a total solid weight of the composition. The content of the polymerizable (e.g., photopolymerizable) monomer may be less than or equal to about 50 wt %, for example, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % based on a total solid weight of the composition.

The initiator in the composition may be used for polymerization of the monomers. The initiator is a compound accelerating a radical reaction (e.g., radical polymerization of monomer) by producing radical chemical species under a mild condition (e.g., by heat or light). The initiator may be a thermal initiator or a photo initiator. It photoinitiator is a compound capable of initiating a radical polymerization of the polymerizable acrylic monomer and/or a thiol compound (will be described later) by light. The type of the initiator is not particularly limited and may be appropriately selected.

In the composition, the content of the initiator may be appropriately adjusted considering types and contents of the polymerizable monomers. In an embodiment, a content of the initiator may be about 0.01 wt % to about 10 wt % based on a total weight of the composition, but is not limited thereto.

The composition may further include a (multiple or mono-functional) thiol compound having at least one thiol group at the terminal end, a metal oxide particulate, or a combination thereof.

The metal oxide fine particles (hereinafter, referred to as particle) may include $TiO_2$, $SiO_2$, $BaTiO_3$, $Ba_2TiO_4$, ZnO, or a combination thereof. The metal oxide particles may have an appropriately selected diameter without a particular limit. The metal oxide particles may have a diameter of greater than or equal to about 100 nm, for example greater than or equal to about 150 nm or greater than or equal to about 200 nm and less than or equal to about 1000 nm, or less than or equal to about 800 nm. In the composition, the content of the metal oxide particles may be greater than or equal to about 1 wt %, greater than or equal to about 5 wt %, greater than or equal to about 10 wt %, or greater than or equal to about 15 wt % and less than or equal to about 35 wt %, less than or equal to about 30 wt %, less than or equal to about 20 wt %, less than or equal to about 10 wt %, or less than or equal to about 5 wt % based on the solid content of the composition.

The content of the thiol compound may be greater than or equal to about 1 wt %, greater than or equal to about 5 wt %, greater than or equal to about 10 wt %, greater than or equal to about 15 wt %, or greater than or equal to about 20 wt % based on a total solid weight of the composition. The content of the thiol compound may be less than or equal to about 50 wt %, less than or equal to about 40 wt %, less than or equal to about 30 wt %, less than or equal to about 25 wt %, less than or equal to about 20 wt %, or less than or equal to about 15 wt % based on a total solid weight of the composition.

The composition may further include an organic solvent (or a liquid vehicle). Types of the usable organic solvent are not particularly limited. The types and contents of the organic solvent may be appropriately determined by considering the aforementioned main components (i.e., the quantum dot, the dispersing agent, the polymerizable monomer, the initiator, and if used, the thiol compound,) and types and contents of additives that will be described below. The composition may include a solvent in a residual amount except for a desired content of the (non-volatile) solid.

If desired, the composition may further include various additives such as a light diffusing agent, a leveling agent, or a coupling agent in addition to the aforementioned components. The content of the additive is not particularly limited, and may be controlled within an appropriate range wherein the additive does not cause an adverse effect on preparation of the composition and production of the quantum dot-polymer composite and optionally a patterning of the composite.

If used, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt % based on a total weight of the composition, but is not limited thereto. If used, the content of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt % based on a total weight of the composition, but is not limited thereto.

The composition according to an embodiment may be produced by a method including preparing a quantum dot dispersion including the aforementioned quantum dots, the aforementioned dispersing agent, and organic solvent; and mixing the quantum dot dispersion with the initiator; polymerizable monomer (e.g., acrylic monomer); optionally thiol compound; optionally metal oxide particulates, and optionally the aforementioned additive. Each of the aforementioned components may be mixed sequentially or simultaneously, and the order is not particularly limited.

Specific types of compositions such as the first monomer, the second monomer, the third monomer, the carboxylic acid group-containing polymer, an acrylic monomer, an initiator, a solvent, a thiol compound, various types of additives, and preparation of compositions may refer to US-2017-0059988-A1, which is incorporated herein in its entirety. The composition may provide a quantum dot-polymer composite (or its pattern) by (e.g., radical) polymerization.

In an embodiment, a display device includes a light emitting element (e.g., a photoluminescent element) and optionally a light source, and the light emitting element includes a light emitting layer, which may be optionally disposed on a (transparent) substrate, and the light emitting layer includes a film or patterned film of the quantum dot-polymer composite. If present, the light source is configured to provide the light emitting element with incident light. The incident light may have a peak wavelength of greater than or equal to about 440 nm, for example, greater than or equal to about 450 nm, greater than or equal to about 455 nm, or greater than or equal to about 460 nm, and less than or equal to about 560 nm, less than or equal to about 500 nm, less than or equal to about 480 nm, less than or equal to about 470 nm, or less than or equal to about 460 nm.

The light source may be an element emitting an excitation light. The excitation light may include blue light and optionally green light. The light source may include an LED. The light source may include an organic LED (e.g. OLED). In an embodiment, on a front side (i.e. light emitting face) of the first section and the second section is disposed a first optical element cutting (e.g., absorbing or reflecting) blue light and optionally green light. The light source may include a blue light emitting OLED (organic light emitting diode) and a green light emitting OLED, and in this case, on the third section emitting or transmitting blue light, is disposed an optical element that filters or removes green light.

Figure 2:
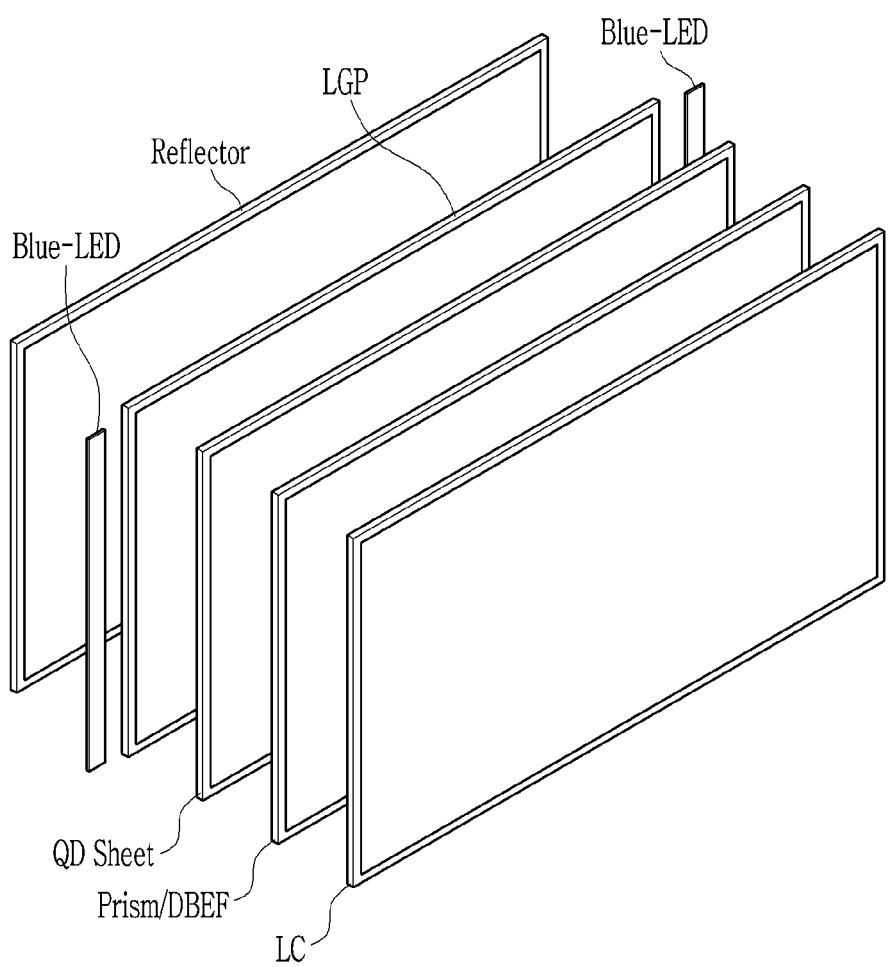
FIG. 2 is a schematic view showing a cross section of a device according to an embodiment.

In an embodiment, the luminescent element may include a sheet of the quantum dot-polymer composite. The display device may further include a liquid crystal panel and the sheet of the quantum dot-polymer composite may be disposed between the light source and the liquid crystal panel. FIG. 2 shows an exploded view of a non-limiting display device. Referring to FIG. 2, the display device may have a structure wherein a reflector, a light guide panel (LGP) and a blue LED light source (blue-LED), the quantum dot-polymer composite sheet (QD sheet), for example, various optical films such as a prism, double brightness enhance film (DBEF), and the like are stacked and a liquid crystal panel is disposed thereon.

In an embodiment, the light emitting layer may include the quantum dot-polymer composite pattern. The pattern may include at least one repeating section to emit light of a predetermined wavelength. The quantum dot-polymer composite pattern may include a first section emitting first light and/or a second section emitting second light. The quantum dot-polymer composite pattern may be produced by a photolithography method or an inkjet method as described later.

The first light and the second light have a different maximum photoluminescence peak wavelength in a photoluminescence spectrum. In an embodiment, the first light may be red light present at a maximum photoluminescence peak wavelength of about 600 nm to about 650 nm (e.g., about 620 nm to about 650 nm), and the second light may be green light present at a maximum photoluminescence peak wavelength of about 500 nm to about 550 nm (e.g., about 510 nm to about 550 nm). The pattern may further include a third section that emits light (e.g., blue light) and is different from the first light and the second light. The maximum peak wavelength of the third light may be in a range of greater than or equal to about 380 nm and less than or equal to about 480 nm. Alternatively, the third section can allow the blue excitation light to pass through the patterned film of the quantum dot composite, see below.

An optical element (for example, a blue light blocking layer or a first optical filter described later) may be disposed on the front surface (light emitting surface) of the first section and the second section to block (e.g., reflect or absorb) blue light.

In the aforementioned display device, the light source includes a plurality of light emitting units respectively corresponding to the repeating sections (e.g., first section and second section), and the light emitting units may include a first electrode and a second electrode each having a surface opposite the other and an electroluminescent layer disposed between the first electrode and the second electrode. The electroluminescent layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are known but not particularly limited. The light source includes an organic light emitting diode (OLED) emitting blue light (and optionally, green light).

Figure 3A:
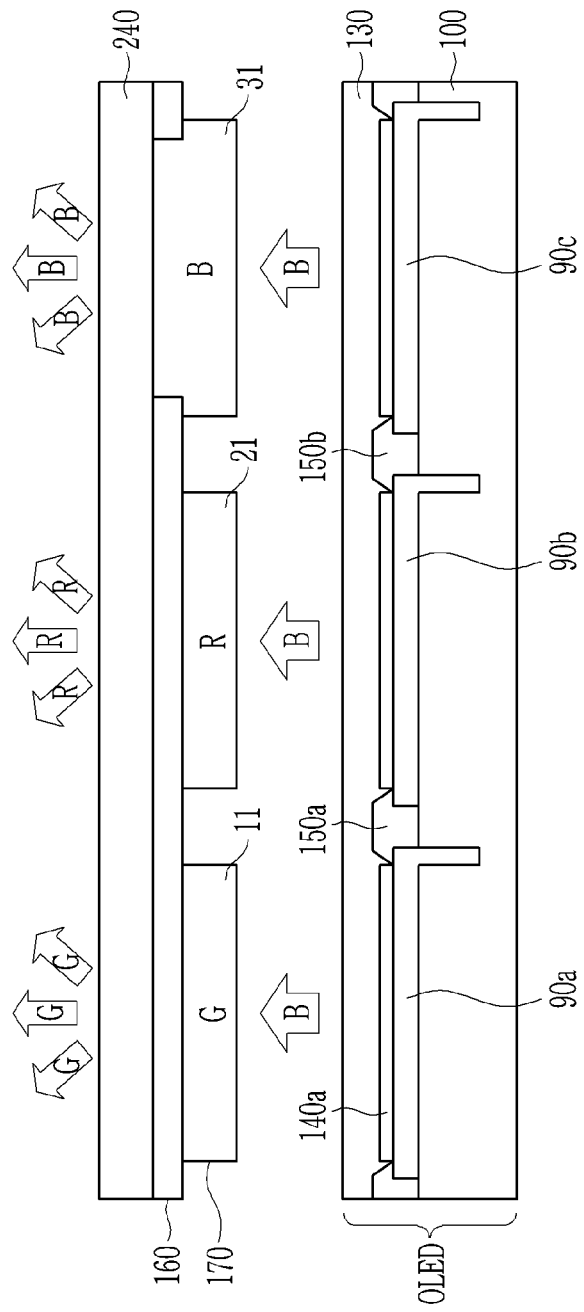
FIG. 3A is a schematic view showing a cross section of a device according to an embodiment.
Figure 3B:
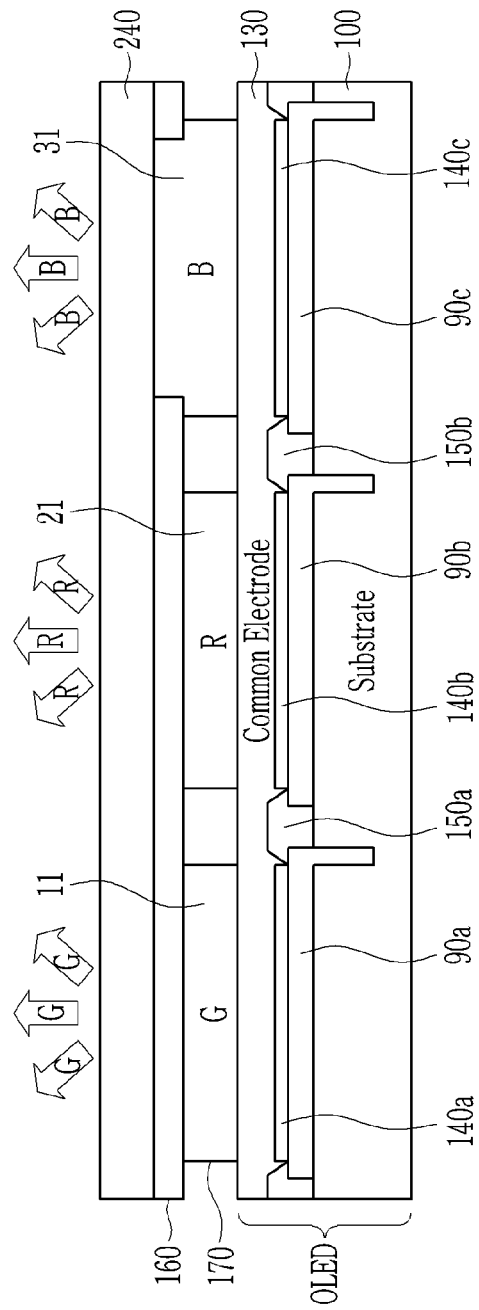
FIG. 3B is a schematic view showing a cross section of a device according to an embodiment.

FIGS. 3A and 3B are schematic cross-sectional views of display devices according to embodiments. Referring to FIGS. 3A and 3B, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c. A thin film transistor and a substrate may be disposed under the organic light emitting diode (OLED).

A stacked structure including a quantum dot-polymer composite pattern 170 (e.g., first section including red quantum dot and second section including green quantum dot) and a substrate may be disposed on the light source. The excitation light (e.g., blue light) emitted from the light source is entered into the first section and the second section configured to emit red light and green light, respectively. The blue light emitted from the light source may pass through the third section. Over the second section 21 emitting red light, the first section 11 emitting green light, or a combination thereof, an optical element 160 may be disposed. The optical element may be an excitation light cut layer or a first optical filter layer 310 (see FIG. 4), which cuts (e.g., reflects or absorbs) the excitation light (e.g., blue light, green light, or a combination thereof). The excitation light cut layer or optical element 160 may be disposed on the upper substrate 240. The excitation light cut layer 160 may be disposed under the upper substrate 240 (e.g., on a bottom surface of the upper substrate 240). In an embodiment, the excitation light may include blue light and optionally green light. When the excitation light includes blue light and green light, a green light cut filter may be disposed on the third section 31.

The excitation light cut layer 160 may be disposed between the upper substrate 240 and the quantum dot-polymer composite pattern and over the first section 11 and the second section 21 and if desired, the third section 31. Details of the excitation light cut layer are the same as set forth for the first optical filter layer below.

The device may be obtained by separately producing the stacked structure and (e.g., blue light emitting) LED or OLED and then assembling the same. Alternatively, the device may be obtained by forming a quantum dot-polymer composite pattern directly on the LED or OLED.

A wire layer including a thin film transistor or the like is formed on the substrate. The wire layer may further include a gate line, a sustain voltage line, a gate insulating layer, a data line, a gate electrode, a source electrode, a drain electrode, a semiconductor layer, a protective layer, and the like. The detailed structure of the wire layer may vary depending on an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described later.

The pixel electrode may function as an anode of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure where the transparent conductive material and the material having light-blocking properties are stacked sequentially.

Between two adjacent pixel electrodes, a pixel define layer (PDL) overlapped with a terminal end of the pixel electrode to divide the pixel electrode into a pixel unit. The pixel define layer is an insulation layer which may electrically block the at least two pixel electrodes.

The pixel define layer covers a portion of the upper surface of the pixel electrode, and the remaining region of the pixel electrode where is not covered by the pixel define layer may provide an opening. An organic light emitting layer that will be described later may be formed on the region defined by the opening.

The organic light emitting layer defines each pixel area by the pixel electrode and the pixel define layer. In other words, one pixel area may be defined as an area where is formed with one organic emission unit layer which is contacted with one pixel electrode divided by the pixel define layer.

For example, in the display device according to an embodiment, the organic light emitting layer may be defined as a first pixel area, a second pixel area and a third pixel area, and each pixel area is spaced apart from each other leaving a predetermined interval by the pixel define layer.

In an embodiment, the organic light emitting layer may emit a third light belong to visible light region or belong to UV region. That is, each of the first to the third pixel areas of the organic light emitting layer may emit third light. In an embodiment, the third light may be a light having the highest energy in the visible light region, for example, may be blue light. When all pixel areas of the organic light emitting layer are designed to emit the same light, each pixel area of the organic light emitting layer may be all formed of the same or similar materials or may show the same or similar properties. Thus, it may greatly relieve a process difficulty of forming the organic light emitting layer, and thus the display device may be easily applied for the large scale/large area process. However, the organic light emitting layer according to an embodiment is not necessarily limited thereto, but the organic light emitting layer may be designed to emit at least two different lights.

The organic light emitting layer includes an organic emission unit layer in each pixel area, and each organic emission unit layer may further include an auxiliary layer (e.g., hole injection layer, hole transport layer, electron transport layer, etc.) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizing plate disposed under the lower substrate, and a liquid crystal layer disposed between the stacked structure and the lower substrate, and in the stacked structure, the photoluminescent layer may be disposed to face the liquid crystal layer. The display device may further include a polarizing plate between the liquid crystal layer and the light emitting layer. The light source may further include LED and if necessary, a light guide panel.

Figure 4:
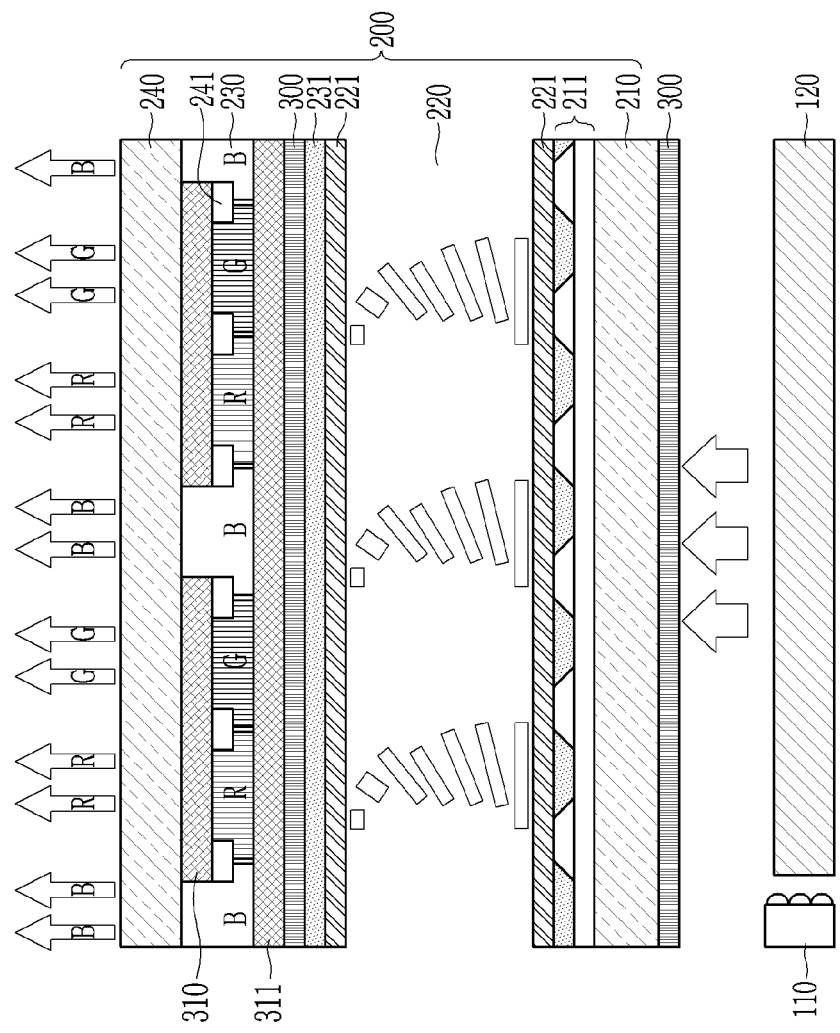
FIG. 4 is a schematic view showing a cross section of a device according to an embodiment.

Non-limiting examples of the display device (e.g., a liquid crystal display device) according to an embodiment are illustrated with reference to the drawing. FIG. 4 is a schematic cross-sectional view showing a liquid crystal display according to an embodiment. Referring to FIG. 4, the display device of an embodiment includes a liquid crystal panel 200, a polarizing plate 300 disposed under the liquid crystal panel 200, and a backlight unit (BLU) disposed under the polarizing plate 300.

The liquid crystal panel 200 includes a lower substrate 210, a stacked structure, and a liquid crystal layer 220 disposed between the stacked structure and the lower substrate. The stacked structure includes a transparent substrate (or referred to as an upper substrate) 240 and a photoluminescent layer 230 including a pattern of a quantum dot-polymer composite.

The lower substrate 210 that is also referred to as an array substrate may be a transparent insulating material substrate. The substrate is the same as described above. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 may be disposed on the wire plate 211. The liquid crystal panel 200 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizing plate 300 is provided under the lower substrate. Materials and structures of the polarizing plate 300 are known and are not particularly limited. A backlight unit (e.g., emitting blue light) may be disposed under the polarizing plate 300.

An upper optical element or an upper polarizing plate 300 may be provided between the liquid crystal layer 220 and the transparent substrate 240, but is not limited thereto. For example, the upper polarizing plate may be disposed between the liquid crystal layer 220 and the photoluminescent layer 230. The polarizing plate may be any polarizer that used in a liquid crystal display device. The polarizing plate may be TAC (triacetyl cellulose) having a thickness of less than or equal to about 200 µm, but is not limited thereto. In another embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector (not shown), a light guide panel (not shown) provided on the reflector and providing a planar light source with the liquid crystal panel 200, and/or at least one optical sheet (not shown) on the light guide panel, for example, a diffusion plate, a prism sheet, and the like, but is not limited thereto. The backlight unit may not include a light guide panel. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, light guide panel, various optical sheets, and a reflector) of such a backlight unit are known and are not particularly limited.

A black matrix 241 is provided under the transparent substrate 240 and the black matrix 241 has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit first light (e.g., red light), a second section (G) configured to emit second light (e.g., green light), and a third section (B) configured to emit/transmit, for example blue light. If needed, the photoluminescent layer may further include at least one fourth section. The fourth section may include a quantum dot that emits different color from light emitted from the first to third sections (e.g., cyan, magenta, and yellow light).

In the photoluminescent layer 230, sections forming a pattern may be repeated corresponding to pixel areas formed on the lower substrate. A transparent common electrode 231 may be provided on the photoluminescent color filter layer (or the photoluminescent layer).

The third section (B) configured to emit/transmit blue light may be a transparent color filter that does not change a photoluminescence spectrum of the light source. In this case, blue light emitted from the backlight unit may enter in a polarized state and may be emitted through the polarizing plate and the liquid crystal layer as it is. If needed, the third section may include a quantum dot emitting blue light.

If desired, the display device may further include a (excitation) light blocking layer (blue light or green light cut filter) or a first optical filter layer. The blue light blocking layer may be disposed between the bottom surfaces of the first section (R) and the second section (G) and the upper substrate 240 or on the top surface of the upper substrate 240. The blue light blocking layer may include a sheet having openings that correspond to a pixel area showing a blue color (e.g., third section) and may be formed on portions corresponding to the first and second sections. As shown in FIG. 4, the first optical filter layer may be integrally formed as one body structure at the portions except portions overlapped with the third section, but is not limited thereto. At least two first optical filter layers may be spaced apart and be disposed on each of the portions overlapped with the first and the second sections.

For example, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, and/or or yellow light that is mixed light thereof.

For example, the first optical filter layer may substantially block blue light having a wavelength of less than or equal to about 500 nm and may transmit light in other visible light wavelength region of greater than about 500 nm and less than or equal to about 700 nm.

For example, the first optical filter layer may have light transmittance of greater than or equal to about 70%, greater than or equal to about 80%, greater than or equal to about 90%, or even about 100% with respect to the other visible light of greater than about 500 nm and less than or equal to about 700 nm.

The first optical filter layer may include a polymer thin film including a dye and/or a pigment that absorbs light having a wavelength to be blocked. The first optical filter layer may block at least 80%, or at least 90%, even at least 95% of blue light having a wavelength of less than or equal to about 480 nm and it may have light transmittance of greater than or equal to about 70%, greater than or equal to about 80%, greater than or equal to about 90%, or even about 100% with respect to other visible light of greater than about 500 nm and less than or equal to about 700 nm.

The first optical filter layer may block (e.g. absorb) or substantially block blue light having a wavelength of less than or equal to about 500 nm and for example may selectively transmit green light or red light. In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include at least one of a first region and a second region wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter layer may contribute to improving color purity of a display device.

The first optical filter layer may be a reflective filter including a plurality of layers (e.g., inorganic material layers) with different reflective index. For example, two layers having different reflective index may be alternately stacked with each other, or for example a layer having a high reflective index and a layer having a low reflective index may be alternately stacked with each other As refractive index different between the layer having a high refractive index and the layer having a low refractive index is higher, the first optical filter layer having higher wavelength selectivity may be provided. A thickness and the stacked number of the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

A total thickness of the first optical filter layer may be, for example, from about 3 nm to about 10,000 nm, about 300 nm to about 10,000 nm, or about 1000 nm to about 10,000 nm. All layers having a high refractive index may have the same thickness and the same material or different from each other, and all layers having a low refractive index may have the same thickness and the same material or different from each other.

The display device may further include a second optical filter layer (e.g., red/green or yellow light recycling layer) disposed between the photoluminescent layer and the liquid crystal layer (e.g., between photoluminescent layer and upper polarizer or polarizing plate) and transmitting at least a portion of the third light and reflecting at least a portion of the first light and the second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated one layer having a relatively planar surface.

In an embodiment, the second optical filter layer may include a monolayer having a low refractive index, for example, it may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, it may be formed by alternately stacking two layers having different refractive indexes, or for example, it may be formed by alternately stacking material having a high refractive index and material having a low refractive index.

The layer having a high refractive index in the second optical filter layer may include, for example, at least one of hafnium oxide, tantalum oxide, titanium oxide, zirconium oxide, magnesium oxide, cesium oxide, lanthanum oxide, indium oxide, niobium oxide, aluminum oxide, and silicon nitride, but according to embodiments, it may include a variety of materials having a higher refractive index than the layer having a low refractive index.

The layer having a low refractive index in the second optical filter layer may include, for example, a silicon oxide, but according to embodiments, it may include a variety of materials having a lower refractive index than the layer having a high refractive index.

As the refractive index difference between the layer having a high refractive index and the layer having a low refractive index is the higher, the second optical filter layer may have the higher wavelength selectivity.

In the second optical filter layer, each thickness of the layer having a high refractive index and the layer having a low refractive index and the stacked number thereof may be determined depending upon a refractive index of each layer and the reflected wavelength, for example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1000 nm to about 10,000 nm. Each of the layer having a high refractive index and the layer having a low refractive index in the second optical filter layer may have the same thickness and materials or different thickness and materials from each other.

The second optical filter layer may reflect at least a portion of the first light (R) and the second light (G) and transmits at least a portion (e.g., whole part) of the third light (B). For example, the second optical filter layer may transmit only the third light (B) in a blue light wavelength region of less than or equal to about 500 nm and light in a wavelength region of greater than about 500 nm, that is, green light (G), yellow light, red light (R), and the like may be not passed through the second optical filter layer and reflected. Thus, the reflected green light and red light may pass through the first and the second sections to be emitted to the outside of the display device.

The second optical filter layer may reflect light in a wavelength region of greater than about 500 nm in greater than or equal to about 70%, greater than or equal to about 80%, or greater than or equal to about 90%, or even about 100%.

Meanwhile, the second optical filter layer may have a transmittance to light in a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or even about 100%.

In another embodiment, the aforementioned quantum dot-polymer composite pattern may be produced by a method using the photoresist composition. The method may include forming a film of the aforementioned composition on a substrate;

exposing a selected region of the film to light (e.g., a wavelength of less than or equal to about 400 nm); and developing the exposed film with an alkali developing solution to obtain a pattern of the quantum dot-polymer composite.

Figure 5:
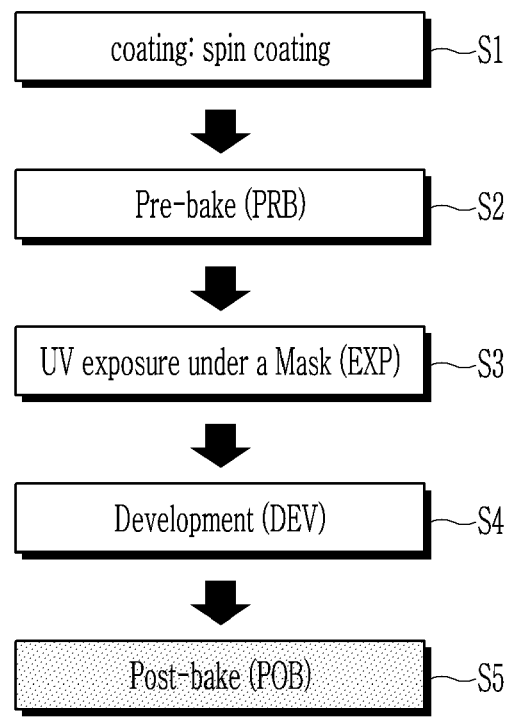
FIG. 5 is a schematic view showing a pattern forming process using the composition according to an embodiment.
Figure 5:
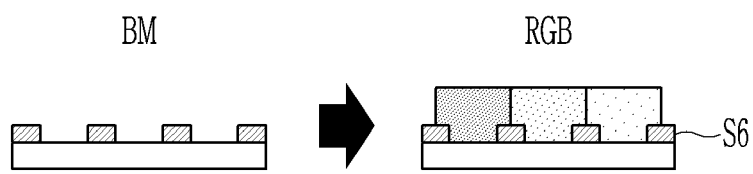

The substrate and the composition are the same as described above. Non-limiting methods of forming the aforementioned pattern are illustrated, referring to FIG. 5.

The aforementioned composition is coated to have a predetermined thickness on a substrate in an appropriate method of spin coating, slit coating, and the like (S1). The formed film may be, optionally, pre-baked (PRB) (S2). The pre-baking may be performed by selecting an appropriate condition from known conditions of a temperature, time, an atmosphere, and the like.

The formed (or optionally pre-baked) film is exposed to light having a predetermined wavelength under a mask having a predetermined pattern (S3). A wavelength and intensity of the light may be selected considering types and contents of the photoinitiator, types and contents of the quantum dots, and the like.

The exposed film is treated with an alkali developing solution (e.g., dipping or spraying) to dissolve an unexposed region and obtain a desired pattern (S4). The obtained pattern may be, optionally, post-baked (FOB) to improve crack resistance and solvent resistance of the pattern, for example, at a temperature of greater than or equal to about 150° C., for example, greater than or equal to about 180° C. and less than or equal to about 230° C., for example, less than or equal to about 200° C. for a predetermined time (e.g., greater than or equal to about 10 minutes or greater than or equal to about 20 minutes) (S5). The quantum dot-polymer composite including the quantum dot of an embodiment may exhibit a blue light conversion rate of greater than or equal to about 29%, for example, greater than or equal to about 30%, or greater than or equal to about 31% even after 30 minutes heat treatment at 180° C.

When the quantum dot-polymer composite pattern has a plurality of repeating sections, the quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green light emitting quantum dot, or optionally, a blue light emitting quantum dot) and repeating a formation of the aforementioned pattern about each composition necessary times (e.g., twice or more or three times or more) (S6). For example, the quantum dot-polymer composite pattern may have a pattern of at least two repeating color sections (e.g., RGB sections). This quantum dot-polymer composite pattern may be used as a photoluminescence-type color filter in a display device.

In another embodiment, the aforementioned stacked structure may be produced using an ink composition. The method may include depositing the same (e.g. to provide a desirable pattern) on the desirable substrate using an appropriate system (e.g., droplet discharging device such as inkjet or nozzle printing device) and heating the same to remove a solvent and to perform a polymerization. The method may provide a highly precise quantum dot-polymer composite film or pattern in a simple way for a short time.

Another embodiment provides an electronic device including the aforementioned quantum dot. The device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary embodiments of the present invention, and the present invention is not limited thereto.

EXAMPLES

Analysis Methods

[1] UV-Vis Spectroscopy Analysis

UV-Vis spectroscopy analysis is performed by using an Agilent Cary5000 spectrophotometer.

[2] Photoluminescence Analysis

A Hitachi F-7000 spectrophotometer is used to obtain photoluminescence (PL) spectra of the produced quantum dots at excitation wavelength of 450 nm.

[3] ICP AES Analysis

Shimadzu ICPS-8100 is used to perform inductively coupled plasma-atomic emission spectrometry (ICP-AES).

[4] Blue Light Absorption Rate and Blue Light Conversion Rate of Composites

The light amount (B) of the blue excitation light is measured using an integrating sphere. Subsequently, a QD polymer composite is put in the integrating sphere and then, irradiated by blue excitation light to measure a light dose (A)

of green (or red) light emitted from the composite and a light dose (B') of blue light also emitted from the quantum dot.

The measurements are used according to the following equation to calculate a blue light absorption rate and a blue light conversion rate.

Blue light absorption rate=$(B-B')/B$

Blue light conversion rate=$A/B$

[4] QE Measurement of Quantum Dot Composite

A quantum dot-polymer composite having a single film is manufactured (e.g., in a method described below), and quantum efficiency (QE) of the quantum dot composite is measured by using the integrating sphere.

[5] Low Temperature PL Analysis

A PL equipment equipped with low temperature measurement (Manufacturer: Hitachi Tech Co., Ltd. Model Name: F7000) is used. In a light path area filled with liquid nitrogen, a sample loaded in an MR tube is mounted to perform a low temperature PL analysis at 77k. The obtained PL peak is deconvoluted into a peak at −0.45 eV and a main peak, and then, an area of each graph is integrated to obtain a deep trap ratio.

[6] Transmission Electron Microscopic (TEM) Analysis

A transmission electron microscopic analysis is performed using a UT F30 Tecnai electron microscope.

Example 1

Example 1-1: Preparation of InZnP Core

Zinc acetate and oleic acid are dissolved in 1-octadecene (ODE) in a 200 milliliters (ml) reaction flask and heated at 120° C. under vacuum, and then cooled to room temperature to obtain a zinc oleate solution.

In a reaction flask, indium acetate and lauric acid along with the zinc oleate solution are heated at 120° C. under vacuum. Indium and lauric acid are used in a mole ratio of 1:3. After one hour under vacuum, nitrogen is added to the reaction flask, and while the temperature of the reaction flask is increased to 250° C., a mixed solution of tris(trimethylsilyl)phosphine ((TMSi)$_3$P) and trioctylphosphine (TOP), and optionally, the zinc oleate solution are rapidly added to the reaction flask. During the reaction in progress, an indium oleate solution, a mixed solution of (TMSi)$_3$P and TOP and zinc oleate solution are sequentially injected into the reaction flask. A total reaction time is 30 minutes.

The indium, zinc, and phosphorous are used in a mole ratio of 1.15:1.5:0.9.

A TEM analysis of the obtained InZnP core is performed. As a result, the core has an average size of about 1.9 nm.

Example 1-2: Synthesis and Characterization of Core-Shell Quantum Dot

Selenium (Se) is dispersed in TOP at 120° C. to prepare a Se/TOP solution. Sulfur (S) is dispersed in TOP to prepare a S/TOP solution. Aluminum chloride is dispersed in TOP and stirred therewith at 100° C. to prepare an aluminum chloride-TOP adduct (hereinafter, referred to be AlCl$_3$-TOP).

Zinc acetate and oleic acid are dissolved in trioctylamine in a 300 mL reaction flask and vacuum-treated at 120° C. for 10 minutes to obtain a zinc precursor. Nitrogen (N$_2$) is then added to the flask and the temperature is increased to 280° C., and after predetermined time, the reaction mixture is cooled to a predetermined temperature.

The InZnP core prepared in Example 1-1 and the selenium precursor (i.e., Se/TOP solution prepared by dispersing Se powder in TOP) are added to the reaction flask in a predetermined ratio, and heated and permitted to react at a high temperature of greater than or equal to 300° C. to form a ZnSe-containing layer.

When the Se precursor is exhausted from the reaction system, the S/TOP solution (i.e., sulfur precursor) and 0.072 millimoles (mmol) of ZnCl$_2$ are simultaneously injected into the reaction system, followed by the injection of 0.08 mmol of AlCl$_3$-TOP to the reaction system. The reaction is performed for 1 hour in total to form a ZnS-containing layer including zinc sulfide.

The obtained reaction mixture is cooled to room temperature. Ethanol is added to the cooled reaction mixture to facilitate the formation of a precipitate. The formed precipitate mixture is centrifuged to obtain core-shell quantum dots, which are then dispersed in toluene.

In the reaction, the zinc precursor, the selenium precursor, and the sulfur precursor are used in a mole ratio of about 6:1.6:1.7. Moreover, the total amount of zinc precursor used in the preparation is about 5.3 times more (moles) than the indium precursor that is used to form the core.

An excessive amount of ethanol is added to the reactant including the InZnP/ZnSe/ZnS quantum dot and then, centrifuged. After centrifugation, a supernatant is discarded, and the precipitate is dried and dispersed in chloroform or toluene to obtain a core-shell quantum dot solution (hereinafter, a QD solution).

Figure 6:
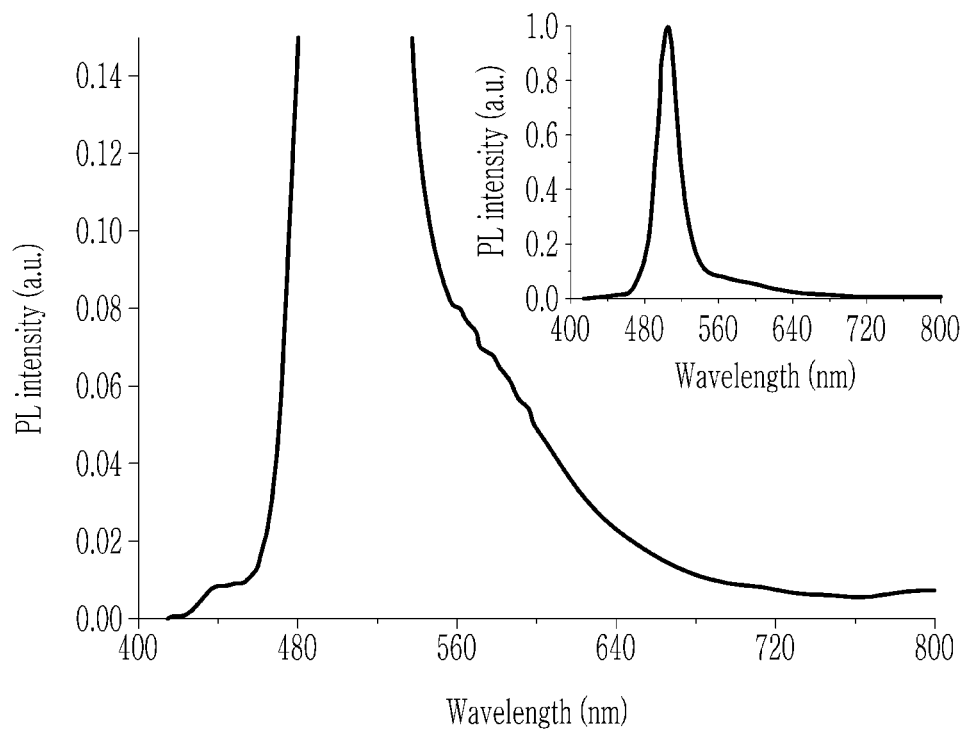
FIG. 6 is a view showing results of a low temperature photoluminescence analysis of a quantum dot prepared in Examples.

An ICP-AES analysis of the obtained QD is performed, and the results are shown in Table 2. UV-Vis spectroscopy and photoluminescence analysis of the obtained QD are performed, and the results are shown in Table 1. Low temperature PL analysis of the obtained core-shell quantum dots is performed and the results are shown in Table 1 and FIG. 6.

Example 1-3: Production of Quantum Dot-Polymer Composite and Pattern Thereof (1) Preparation of Quantum Dot-Binder Dispersion The chloroform dispersion of the core-shell quantum dots obtained in Example 1-2 is mixed with a binder (quaternary copolymer of methacrylic acid, benzyl methacrylate, hydroxyethylmethacrylate, and styrene, acid value: 130 mg KOH/g, molecular weight: 8000, methacrylic acid:benzyl methacrylate:hydroxyethyl methacrylate:styrene (mole ratio)=61.5%:12%:16.3%:10.2%) solution (polypropylene glycol monomethyl ether acetate (PGMEA) having a concentration of 30 wt %) to prepare quantum dot-binder dispersion.

(2) Preparation of Photosensitive Composition

The quantum dot binder dispersion is mixed with hexaacrylate having the following structure as a photopolymerizable monomer, glycol di-3-mercaptopropionate (hereinafter, 2T), an oxime ester compound as an initiator, and TiO$_2$ as a light diffusing agent, and PGMEA to prepare a composition.

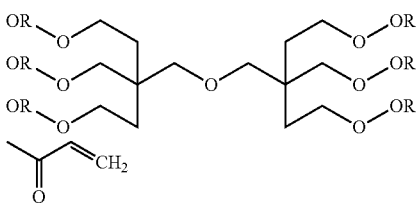

The prepared composition includes 40 weight percent (wt %) of the quantum dots, 12.5 wt % of the binder polymer, 25 wt % of 2T, 12 wt % of the photopolymerizable monomer, 0.5 wt % of the initiator, and 10 wt % of the light diffusing agent based on a solid content of the composition, and the total solid content is 25 wt %.

(3) Production of Quantum Dot-Polymer Composite Pattern and Heat Treatment

Each photosensitive composition is spin-coated on a glass substrate at 150 rpm for 5 seconds to obtain films. The films are pre-baked (PRB) at 100° C. These pre-baked films are exposed to irradiation of light (a wavelength: 365 nm, intensity: 100 mJ) for 1 second under a mask having a predetermined pattern (e.g., a square dot or a stripe pattern), developed in a potassium hydroxide aqueous solution (a concentration: 0.043 wt %) for 50 seconds to obtain quantum dot-polymer composite patterns (a thickness: 6 um).

The obtained patterns are heat-treated (FOB) at 180° C. for 30 minutes under a nitrogen atmosphere.

A photoluminescence analysis and a measurement of a photo-conversion efficiency of the obtained film patterns are carried out, and the results are shown in Table 3.

Example 2

Core-shell quantum dots are prepared according to the same method as Example 1-2 except that the mole ratio of the S is changed to 3.06 during shell formation). An ICP-AES analysis of the obtained QD is performed, and the results are shown in Table 2. UV-Vis spectroscopy and photoluminescence analysis of the obtained QD are performed, and the results are shown in Table 1.

A quantum dot-polymer composite is obtained according to the same method as Example 1-3 except that the core-shell quantum dots of Example 2 are used. With respect to the obtained film pattern, photo-conversion efficiency of a single film is measured, and the result is shown in Table 3.

Example 3

A core-shell quantum dot is prepared according to the same method as Example 1 except that the In:Zn:P mole ratio is 1.125:3:1.725 to form a core. An ICP-AES analysis of the obtained QD is performed, and the results are shown in Table 2. UV-Vis spectroscopy and photoluminescence analysis of the obtained QD are performed, and the results are shown in Table 1.

A quantum dot-polymer composite and a pattern thereof are obtained according to the same method as Example 1-3 except that the core-shell quantum dots of Example 3 are used. With respect to the obtained film pattern, blue light-conversion efficiency of a single film is measured, and the result is shown in Table 3.

Comparative Example 1

An InZnP core is obtained according to the same method as Example 1-1 except that a mole ratio of In:Zn:P of 6:7:4.5 is used, and without additionally injecting indium, zinc, and phosphorus precursors during the reaction in forming the core. Core-shell quantum dots are obtained according to the same method as Example 1-2 except that the obtained InZnP core of Comparative Example 1 is used, and a mole ratio of Zn:Se:S of 6:1.4:2 is used in the formation of the shell. ICP-AES analysis of the obtained core-shell quantum dots of Comparative Example 1 is performed and the results are shown in Table 2. UV-Vis spectroscopy and photoluminescence analysis of the obtained core-shell quantum dots of Comparative Example 1 are performed, and the results are shown in Table 1.

A quantum dot-polymer composite and a pattern thereof are obtained according to the same method as Example 1-3 except that the core-shell quantum dots of Comparative Example 1 are used. With respect to the obtained film pattern, blue light conversion efficiency of a single film is measured, and the result is shown in Table 3.

Comparative Example 2

An InZnP core is obtained according to the same method as Example 1-1 except that the concentrations of each of the indium, phosphorous, and zinc precursors injected for the core synthesis are increased by 1.43 times, during the reaction, without the multiple injections thereof. Core-shell quantum dots are prepared according to the same method as Example 1-2 except that the obtained InZnP core of Comparative Example 2 is used, and the mole ratio of Zn:Se:S precursors used in the formation of the shell is 6:1.4:2. An ICP-AES analysis of the obtained-shell quantum dots of Comparative Example 2 is performed, and the results are shown in Table 2. UV-Vis spectroscopy and photoluminescence analysis of the obtained core-shell quantum dots of Comparative Example 2 are performed, and the results are shown in Table 1.

A quantum dot-polymer composite and a pattern thereof are obtained according to the same method as Example 1-3 except that the core-shell quantum dots are used. With respect to the obtained film pattern, photo-conversion efficiency of a single film is measured, and the result is shown in Table 3.

TABLE 1

| | maximum PL peak wavelength (nm) | QY | Deep Trap ratio | Size and distribution (nm) | UV-Vis first absorption peak (VD) |
|---|---|---|---|---|---|
| Example 1 | 521 | 90.4% | 1.9% | 5.6 +/− 0.8 | 497 nm (0.49) |
| Example 2 | 519 | 95.2% | 1.5% | 5.8 +/− 0.8 | 495 nm (0.46) |
| Comparative Example 1 | 526 | 84% | 5.7% | 5.9 +/− 1.5 | 502 nm (0.36) |
| Comparative Example 2 | 529 | 79% | 4.3% | 6.1 +/− 0.8 | 502 nm (0.43) |
| Example 3 | 523 | 97% | 2.3% | 5.7+/− 0.7 | 498 nm (0.51) |

TABLE 2

| | ICP-AES (mole ratio relative to In) | | | |
|---|---|---|---|---|
| | Zn | P | S/Se | S + Se |
| Example 1 | 44.2 | 0.92 | 0.452 | 37.9 |
| Example 2 | 51.1 | 0.95 | 0.60 | 42.2 |
| Example 3 | 45.4 | 1.1 | 0.48 | 37.5 |
| Comparative Example 1 | 34.7 | 0.78 | 0.66 | 28.4 |
| Comparative Example 2 | 29.6 | 0.72 | 0.61 | 24.2 |

TABLE 3

|  | maximum PL peak wavelength (nm) | POB QE (%) | Blue light conversion rate (%) |
| --- | --- | --- | --- |
| Example 1 | 534 | 80% | 32.1 |
| Example 2 | 533 | 85% | 33.1 |
| Example 3 | 534 | 89.3% | 34% |
| Comparative Example 1 | 540 | 68.6% | 29.8% |
| Comparative Example 2 | 538 | 68% | 29.5% |

Referring to the results of Tables, the quantum dot-polymer composites including the quantum dots of Examples 1 to 3 may exhibit improved optical properties compared with the quantum dot-polymer composite including the quantum dots of comparative examples.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. An electronic device including a quantum dot, the quantum dot comprising indium, phosphorous, zinc, selenium, and sulfur, wherein the quantum dot has a mole ratio of phosphorus to indium of greater than or equal to 0.75:1 and less than or equal to 1.5:1, and the quantum dot has a mole ratio of zinc to indium of greater than or equal to 35:1 and less than or equal to 60:1, and
the quantum dot is configured to emit green light.

2. The electronic device of claim 1, wherein in the quantum dot, the mole ratio of phosphorus to indium is greater than or equal to about 0.78:1 and less than or equal to about 1.2:1.

3. The electronic device of claim 1, wherein in the quantum dot, the mole ratio of zinc to indium is greater than or equal to about 40:1 and less than or equal to about 55:1.

4. The electronic device of claim 1, wherein in the quantum dot, the mole ratio of phosphorus to indium is greater than or equal to about 0.8:1 and less than or equal to about 1.1:1.

5. The electronic device of claim 1, wherein in the quantum dot, the mole ratio of zinc to indium is greater than or equal to about 42:1 and less than or equal to about 52:1.

6. The electronic device of claim 1, wherein in the quantum dot, a mole ratio of sulfur to selenium is greater than or equal to about 0.3:1 and less than or equal to about 1:1.

7. The electronic device of claim 1, wherein in the quantum dot, a mole ratio of sulfur to selenium is greater than or equal to about 0.4:1 and less than or equal to about 0.65:1.

8. The electronic device of claim 1, wherein the quantum dot has a mole ratio of a sum of sulfur and selenium to indium of greater than or equal to about 10:1 and less than or equal to about 45:1.

9. The electronic device of claim 1, wherein the quantum dot has a mole ratio of a sum of sulfur and selenium to indium of greater than or equal to about 29:1 and less than or equal to about 43:1.

10. The electronic device of claim 1, wherein the quantum dot has a size of greater than or equal to about 4 nanometers and less than or equal to about 8 nm.

11. The electronic device of claim 1, wherein the quantum dot has a size of greater than or equal to about 5 nanometers and less than or equal to about 7 nm.

12. The electronic device of claim 10, wherein the size of the quantum dot exhibits a standard deviation of less than or equal to about 17%.

13. The electronic device of claim 1, wherein the quantum dot has a quantum efficiency of greater than or equal to about 90%.

14. An electronic device including a quantum dot, the quantum dot
comprising indium, phosphorous, zinc, selenium, and sulfur, wherein the quantum dot has a mole ratio of phosphorus to indium of greater than or equal to 0.75:1 and less than or equal to 1.5:1, and a mole ratio of zinc to indium of greater than or equal to 35:1 and less than or equal to 60:1, and
the quantum dot is configured to emit green light, wherein in a photoluminescence spectrum measured at 77K of the quantum dot, a ratio of a deep trap emission peak area to a total area of a maximum emission peak is less than or equal to about 4%.

15. The electronic device of claim 14, wherein in the quantum dot, the mole ratio of phosphorus to indium is greater than or equal to about 0.78:1 and less than or equal to about 1.2:1 and the mole ratio of zinc to indium is greater than or equal to about 40:1 and less than or equal to about 55:1, and
wherein the quantum dot has a size of greater than or equal to about 4 nanometers and less than or equal to about 8 nm, and the size of the quantum dot exhibits a standard deviation of less than or equal to about 17%.

16. A patterned film including a section comprising a quantum dot composite, wherein the quantum dot composite comprises;
a polymer matrix and a quantum dot dispersed in the polymer matrix;
wherein the quantum dot comprises a first semiconductor nanocrystal comprising indium, zinc, and phosphorus, and a second semiconductor nanocrystal comprising zinc, selenium, and sulfur,
wherein in the quantum dot,
a mole ratio of phosphorus to indium is greater than or equal to 0.75:1 and less than or equal to 1.5:1, and
a mole ratio of zinc to indium is greater than or equal to 35:1 and less than or equal to 60:1.

17. The patterned film of claim 16, wherein in the quantum dot, the mole ratio of phosphorus to indium is greater than or equal to about 0.78:1 and less than or equal to about 1.2:1 and the mole ratio of zinc to indium is greater than or equal to about 40:1 and less than or equal to about 55:1.

18. The patterned film of claim 17, wherein in the quantum dot, the mole ratio of phosphorus to indium is greater than or equal to about 0.8:1 and less than or equal to about 1.1:1, and the mole ratio of zinc to indium is greater than or equal to about 42:1 and less than or equal to about 52:1.

19. A color filter comprising the patterned film of claim 16.

* * * * *